(12) United States Patent
Lu et al.

(10) Patent No.: US 10,658,518 B2
(45) Date of Patent: May 19, 2020

(54) MAGNESIUM ZINC OXIDE-BASED HIGH VOLTAGE THIN FILM TRANSISTOR

(71) Applicant: Rutgers, The State University of New Jersey, New Brunswick, NJ (US)

(72) Inventors: Yicheng Lu, East Brunswick, NJ (US); Wen-Chiang Hong, Tigard, OR (US); Chieh-Jen Ku, Edison, NJ (US); Kuang Sheng, Edison, NJ (US); Rui Li, Piscataway, NJ (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 0 days.

(21) Appl. No.: 16/326,575

(22) PCT Filed: Aug. 18, 2017

(86) PCT No.: PCT/US2017/047686
§ 371 (c)(1),
(2) Date: Feb. 19, 2019

(87) PCT Pub. No.: WO2018/035502
PCT Pub. Date: Feb. 22, 2018

(65) Prior Publication Data
US 2019/0237582 A1    Aug. 1, 2019

Related U.S. Application Data

(60) Provisional application No. 62/377,317, filed on Aug. 19, 2016.

(51) Int. Cl.
*H01L 29/786* (2006.01)
*H01L 29/66* (2006.01)
(Continued)

(52) U.S. Cl.
CPC .......... *H01L 29/7869* (2013.01); *C23C 16/40* (2013.01); *C23C 16/403* (2013.01);
(Continued)

(58) Field of Classification Search
None
See application file for complete search history.

(56) References Cited

U.S. PATENT DOCUMENTS

2004/0245523 A1    12/2004    Jen et al.
2013/0045567 A1    2/2013     Zan et al.
(Continued)

OTHER PUBLICATIONS

Smith, et al: "High-Voltage Organic Thin-Film Transistors on Flexible and Curved Surfaces", IEEE Transactions on Electron Devices, Dec. 2015, vol. 62, No. 12, pp. 4213-4219.
(Continued)

*Primary Examiner* — Anthony Ho
*Assistant Examiner* — Kevin Quinto
(74) *Attorney, Agent, or Firm* — Fox Rothschild LLP

(57) ABSTRACT

Magnesium Zinc Oxide (MZO)—based high voltage thin film transistor (MZO-HVTFT) is built on a transparent substrate, such as glass. The device has the circular drain and ring-shaped source and gate to reduce non-uniformity of the electric field distribution. Controlled Mg doping in the channel and modulated Mg doping in a transition layer located at the channel-gate dielectric interface improve the device's operating stability and increase its blocking voltage capability over 600V. The MZO HVTFT can be used for fabricating the micro-inverter in photovoltaic system on glass (PV-SOG), and for self-powered smart glass.

22 Claims, 15 Drawing Sheets

(51) Int. Cl.
    *C23C 16/40*          (2006.01)
    *H01L 29/417*       (2006.01)
    *H01L 21/02*         (2006.01)
    *H01L 29/423*       (2006.01)
    *H01L 29/49*         (2006.01)

(52) U.S. Cl.
    CPC ........ *C23C 16/407* (2013.01); *H01L 21/0262* (2013.01); *H01L 21/02554* (2013.01); *H01L 29/41733* (2013.01); *H01L 29/42384* (2013.01); *H01L 29/4908* (2013.01); *H01L 29/66969* (2013.01); *H01L 2029/42388* (2013.01)

(56) References Cited

U.S. PATENT DOCUMENTS

| | | |
|---|---|---|
| 2013/0168770 A1 | 7/2013 | Jeon et al. |
| 2015/0001539 A1 | 1/2015 | Smith et al. |
| 2015/0014823 A1* | 1/2015 | Mallikarjunan ...... C23C 16/402 257/632 |
| 2015/0155334 A1 | 6/2015 | Lu et al. |

OTHER PUBLICATIONS

Martin et al: "High-Voltage Amorphous Silicon Thin-Film Transistors", IEEE Transactions on Electron Devices, Mar. 1993, vol. 40, No. 3, pp. 634-644.

Hong, et al: "MgZnO High Voltage Thin Film Transistors on Glass for Inverters in Building Integrated Photovoltaics", Scientific Reports 6:34169, Oct. 10, 2016.

* cited by examiner

MAGNESIUM ZINC OXIDE-BASED HIGH VOLTAGE THIN FILM TRANSISTOR

CROSS-REFERENCE TO RELATED APPLICATIONS

This application claims priority under 35 U.S.C. § 119(e) to U.S. Provisional Patent Application Ser. No. 62/377,317, filed on Aug. 19, 2016, which is hereby incorporated by reference in its entirety.

FIELD OF THE INVENTION

The present invention relates to magnesium zinc oxide based high voltage thin film transistors (MZO HVTFT) and applications thereof.

BACKGROUND OF THE INVENTION

For decades, solar energy has been a leading technology in the search to replace fossil-fuel energy as a sustainable and clean energy source. However, cost and efficiency remain as major concerns. As the price of photovoltaics (PV) modules has dropped, the inverters for energy converters now count for more than 10% of the total cost of an entire PV system. Additionally, in a conventional PV system all solar modules link to a central inverter; therefore, the overall system performance can be brought down by an underperforming module in the array or individual solar cells blocked from sunlight.

To solve this problem, and to optimize each individual solar panel, the micro-inverter technology has been proposed to embed inverters into each photovoltaic module. However, at the present time, the cost of micro-inverters is still higher than the cost of centralized inverters in small systems ($\leq 10$ kW). Another major factor hindering the wide adoption of solar energy is a conflict between aesthetics and energy saving. Many consumers find the placement of arrays of solar panels on buildings to be unsightly.

Consequently ways of integrating photovoltaics into buildings, i.e. Building Integrated Photovoltaics (BIPV) have been proposed. BIPVs serve as building elements so that the appearance of houses won't be compromised due to the post-installation of solar panels. To address these two major issues, it is desired to have inverters which can be integrated with solar modules to form a transparent solar PV system on glass (PV-SOG). In a PV-SOG, in addition to inverters, all other components including solar cells and controller circuits can be designed using the same process. Therefore, not only the cost but also the unit size of a PV system is reduced. The transparency and scalability of the PV-SOG's exterior appearance make them attractive for application to BIPVs. Moreover, PV-SOG's possess better system reliability since every solar module is integrated with an individual inverter or inverter array.

The high voltage devices are the core of the inverters. Currently, state-of-the-art high voltage and high power devices use the popular SiC and GaN transistors. However, both of these wide bandgap semiconductors require epitaxial growth at high temperature on strictly selected single-crystal substrates, which excludes their application in SOGs. In contrast, thin film transistor (TFT) technology made at low temperature has become a promising candidate for PV-SOG. Several semiconductor materials have been tried out to make high voltage thin film transistor (HVTFT) devices. Amorphous Si and poly-Si HVTFTs have been studied since the 1980s. Although amorphous Si can provide high voltage up to 800 V; however, its poor performance (on/off ratio $\sim 10^4$) due to its low mobility limits its application. Poly-Si HVTFTs show better driving capability, but their low blocking voltage and non-uniformity from grain boundaries make them inadequate to meet the requirements of PV-SOG. In addition, Si-based TFT technology suffers from the absorption of visible light, restricting its application for transparent electronics. Organic TFTs which offer low cost and low process temperature have been used in display and RFID technologies. A high-voltage organic thin-film transistor (HVOTFT) has been reported to show switch drain-to-source voltages higher than 300 V with a controlling voltage range from 0 to 20 V. However, its low mobility, poor long-term stability and degradation at higher temperatures exclude its application in PV-SOGs, which operate under sunlight radiation, and its lifetime, like the regular residential solar cells, is expected to be more than 25 years.

Since the report of Indium Gallium Zinc Oxide (IGZO) TFTs with high electrical performance at low process temperature, oxide semiconductor TFTs have emerged in many applications, especially in displays, and transparent electronics. In the area of HVTFT, it was reported that an IGZO HVTFT operated at above 100 V with an on/off current ratio of $10^7$. Although this is beyond the regular operating voltage in TFTs, it is still not sufficient to be used in inverters for a solar PV system. Furthermore, it is desired to use indium-free materials due to the high cost of indium, especially in the case of large-area electronic systems such as solar cells. In addition, the toxicity of IGZO due to its high indium concentration is of considerable environmental concern.

A need thus exists to develop a new HVTFT on glass technology for the micro-inverters which can be integrated with solar modules to form the PV-SOG. It is also desirable to provide HVTFTs for various high voltage applications at low cost, such as self-powered smart glass.

SUMMARY

The present invention provides a magnesium zinc oxide-based high voltage thin film transistor (MZO-HVTFT). The MZO-HVTFT includes a substrate, a conducting gate over the substrate, a gate dielectric insulating layer over the gate, a Mg-composition-tailored magnesium zinc oxide (MZO) transition layer (TL) represented by $Mg_yZn_{1-y}O$, wherein in the illustrated embodiment y is continuously modulated ($x \leq y \leq 1.0$); a semiconducting channel layer comprising magnesium zinc oxide represented by $Mg_xZn_{1-x}O$, wherein x is fixed and its value is selected in the range of $0 < x \leq 0.05$ in the illustrated embodiment; a source and a drain that connect the channel. The MZO HVTFT can also include a passivation layer deposited on top of the MZO HVTFT to protect it from ambient influences (e.g. contaminants, moisture) and mechanical scratch.

Although in the illustrated embodiments specific ranges are disclosed for values of, for example thickness, doping density, specific materials and characteristics are described, it should be noted that such ranges, characteristics and materials are merely illustrative for achieving a desired performance. As performance criteria change, other ranges, characteristics and materials may be substituted, as known by those familiar with semiconductor device physics and technology.

To improve the TFT stability, including the thermal, threshold voltage, and especially the negative bias stress (NBS) stability, a small amount of Mg composition (x) is doped into ZnO to form $Mg_xZn_{1-x}O$ (MZO, $0<x\leq0.05$) as the TFT channel to reduce the density of oxygen vacancies in MZO.

To improve the electric field uniformity thus, enabling the high blocking voltage, the HVTFT in the illustrated embodiment has a circular-symmetric design: the channel (ring), source (ring), gate (ring), and drain (circle) have a concentric circular shape.

In the illustrated embodiments, the MZO-HVTFT further includes interface modification by inserting a thin transition layer (TL) containing $Mg_yZn_{1-y}O$, wherein $x\leq y\leq1.0$. In the illustrated embodiments y decreases from 1.0 (MgO) at the interface with gate dielectric layer to the same Mg composition value x ($0<x\leq0.05$) at the interface with the $Mg_xZn_{1-x}O$ (MZO) channel layer.

In the illustrated embodiments, the transition layer (TL) has a thickness ranging from 5 nm to 15 nm. The optimized thickness is determined by considering that the TL has the sufficient thickness to serve as the diffusion barrier to effectively block the Zn diffusion from MZO channel to $SiO_2$ gate dielectric; however, the TL is thin enough to have proper turn-on voltage and current.

In the illustrated embodiments, the channel length (distance between source and drain), the first offset distance between the gate and the drain, and the second offset distance between the gate and the source are designed and balanced to reach the required blocking voltage and on-current. For example, in some embodiments, the distance between source and drain is ranged by 5 to 30 μm. In some embodiments, the first offset distance $L_{GD}$ between the gate and the drain ranges from 3 to 25 μm and the second offset distance $L_{GS}$ between the gate and the source ranges from 2 to 5 μm, respectively. The Gate-Drain Offset $L_{GD}$ is longer than the Gate-Source Offset region $L_{GS}$ because in the HVTFT the high voltage bias is added on the drain terminal. Therefore, larger gate-drain offset assure to sustain high voltage bias. In all cases, however, because of the concentric arrangement of the gate, source and drain, each offset distance remains constant once it is determined.

In the illustrated embodiments, the substrate is a transparent material including but not limited to glass and ceramics.

Another aspect of the invention provides articles of application of the MZO HVTFT noted above. Examples of such application articles include inverters for photovoltaic system on glass (PV-SOG), a BIPV system. In some embodiments, the article of application is a self-powered smart glass technology. In some embodiments, the article of application is in the imaging path high speed printers and digital radiology instruments.

Another aspect of the invention provides a method of manufacturing the MZO-HVTFT, comprising the steps of (a) depositing a gate electrode on a glass substrate;
(b) depositing a gate dielectric layer, such as $SiO_2$ on the top of the gate;
(c) depositing a thin $Mg_yZn_{1-y}O$ transition layer (MZO-TL) on the top of the dielectric layer, wherein in a preferred embodiment the Mg composition y ($x\leq y\leq1.0$) is continuously tailored from y=1.0 (at the $SiO_2$ interface) to the same value of the MZO channel layer ($0<x\leq0.05$) at the MZO-TL and MZO channel interface;
(d) depositing a channel layer comprising $Mg_xZn_{1-x}O$ (MZO) on the top of the transition layer (TL) wherein the Mg composition x is selected in the range ($0<x\leq0.05$) so as to suppress the oxygen vacancies and keep high electron mobility;
(e) depositing source and drain electrodes on the channel layer; and
(f) forming a proper passivation layer on the MZO HVTFT to protect it from the ambient influences and mechanical scratch.

In some embodiments, $Mg_yZn_{1-y}O$ (MZO-TL)/$Mg_xZn_{1-x}O$ dual-layer structure is manufactured using the MOCVD with interface engineering; wherein the Mg and Zn compositions are tailored during growth without breaking the vacuum. In some embodiments, $Mg_yZn_{1-y}O$ (MZO-TL)/$Mg_xZn_{1-x}O$ dual-layer structure is manufactured using the ALD and PVD with interface engineering; wherein the Mg and Zn compositions are tailored during growth without breaking the vacuum.

μm). The erro bar provides mean, maximum (Max), minimum (Min), plus one standard deviation (1SD) and minus one standard deviation (−1SD) values. The numbers of data points are taken from 25, 25, and 15 devices with the channel length of 10, 15, and 25 am.

FIGS. 7(a)-(d) show (a) top view of an HVTFT with a ring structure; (b) top view of an HVTFT with a rectangular structure; (c) Simulation results of the electrical field distribution in the HVTFT channel with a ring structure; and (d) Simulation results of the electrical field distribution in the HVTFT channel with a rectangular structure.

Figure 8:
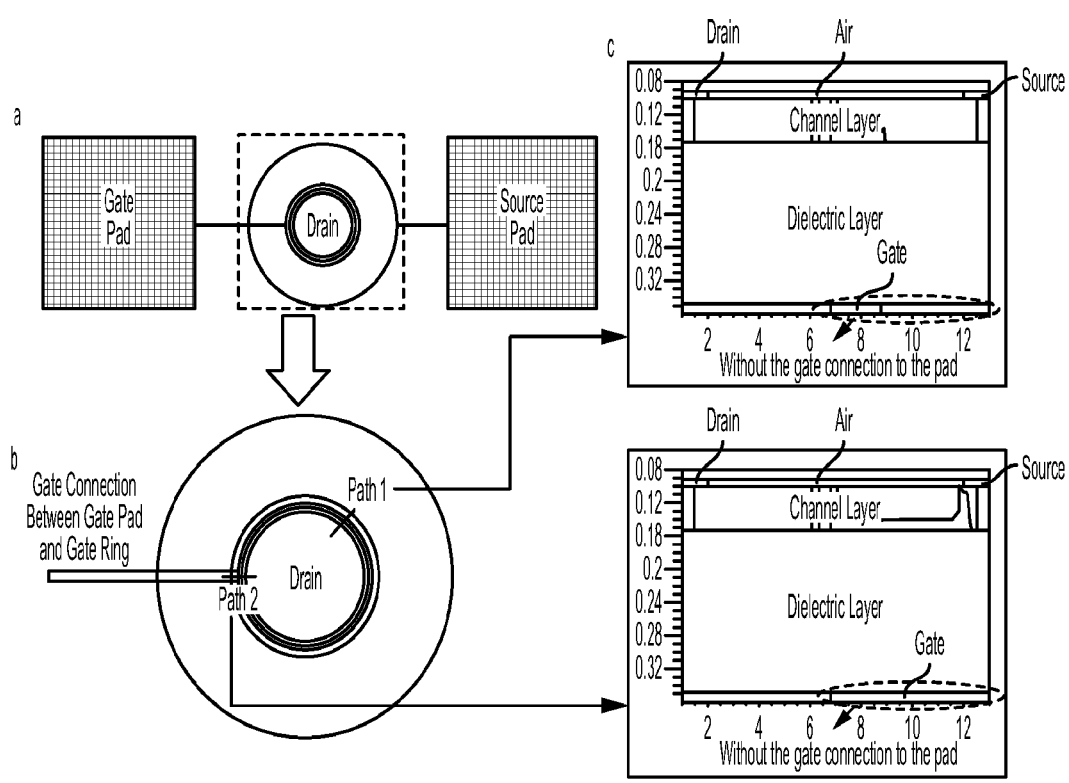

FIGS. 8(a)-(c) show schematics of 2D simulation areas of a HVTFT with and without the gate connection: (a) top-view of the whole device, (b) two simulation paths, and (c) cross-sectional view of two structures along two paths.

Figure 9:
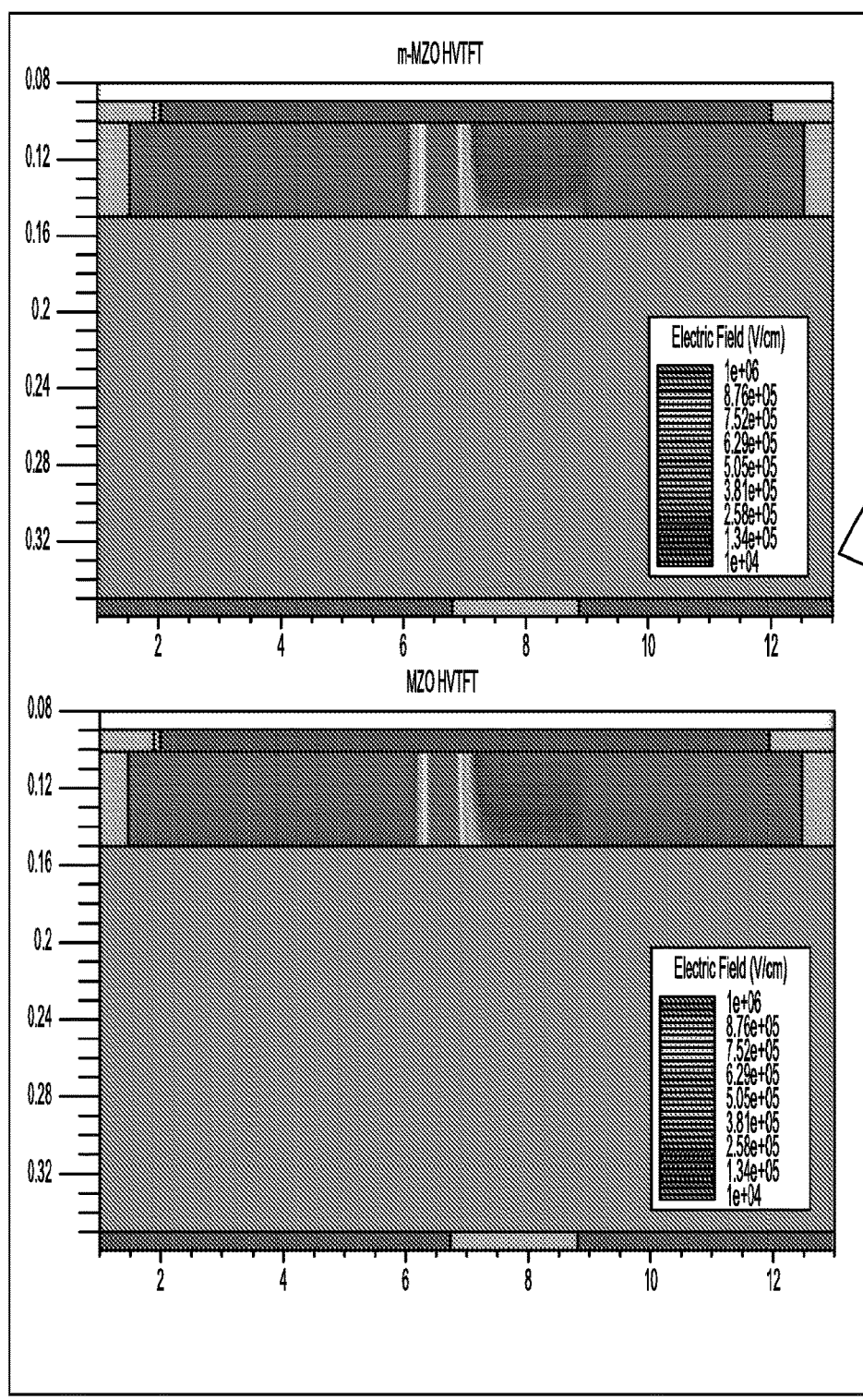
Figure 9:
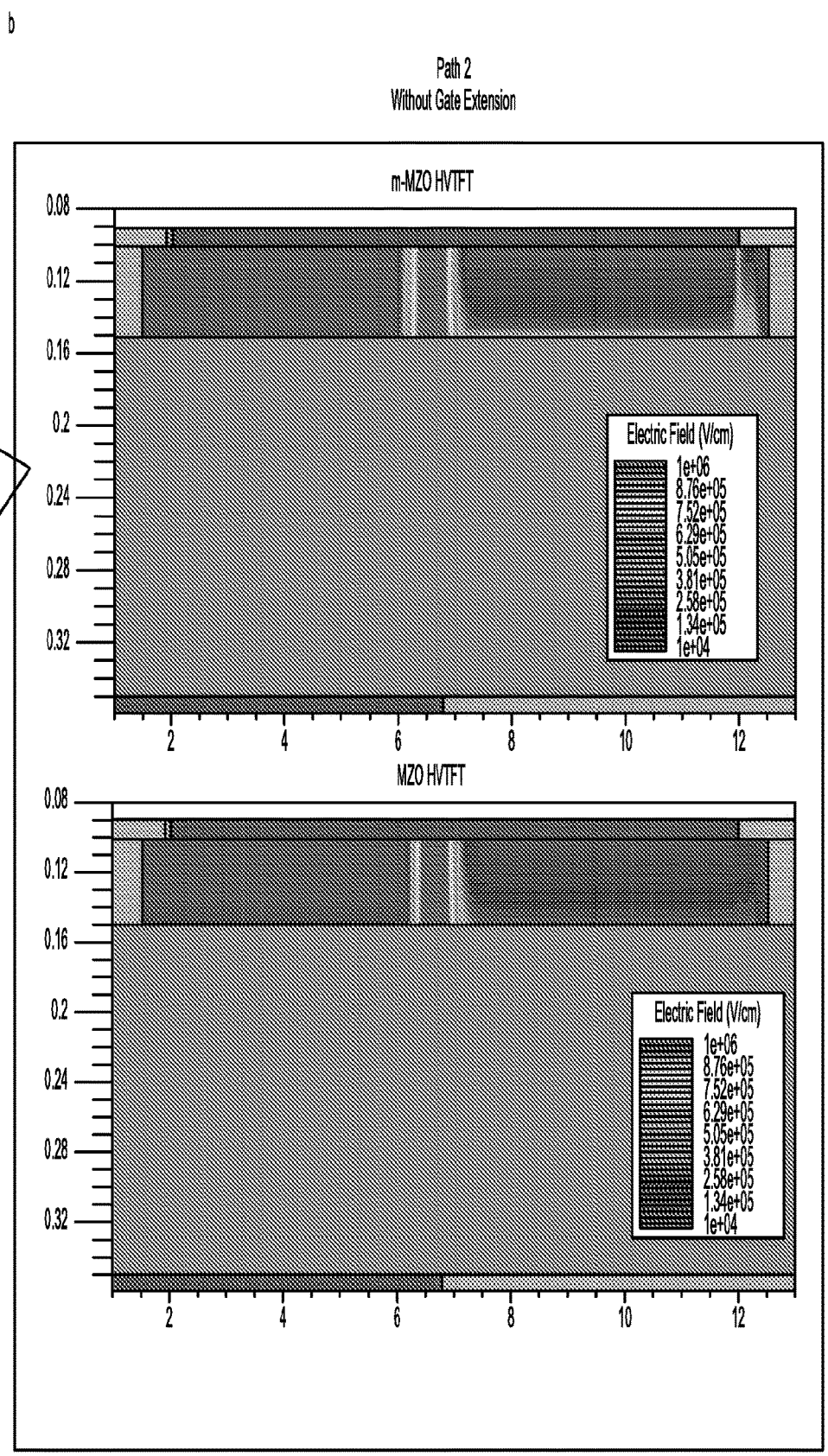
Figure 9:
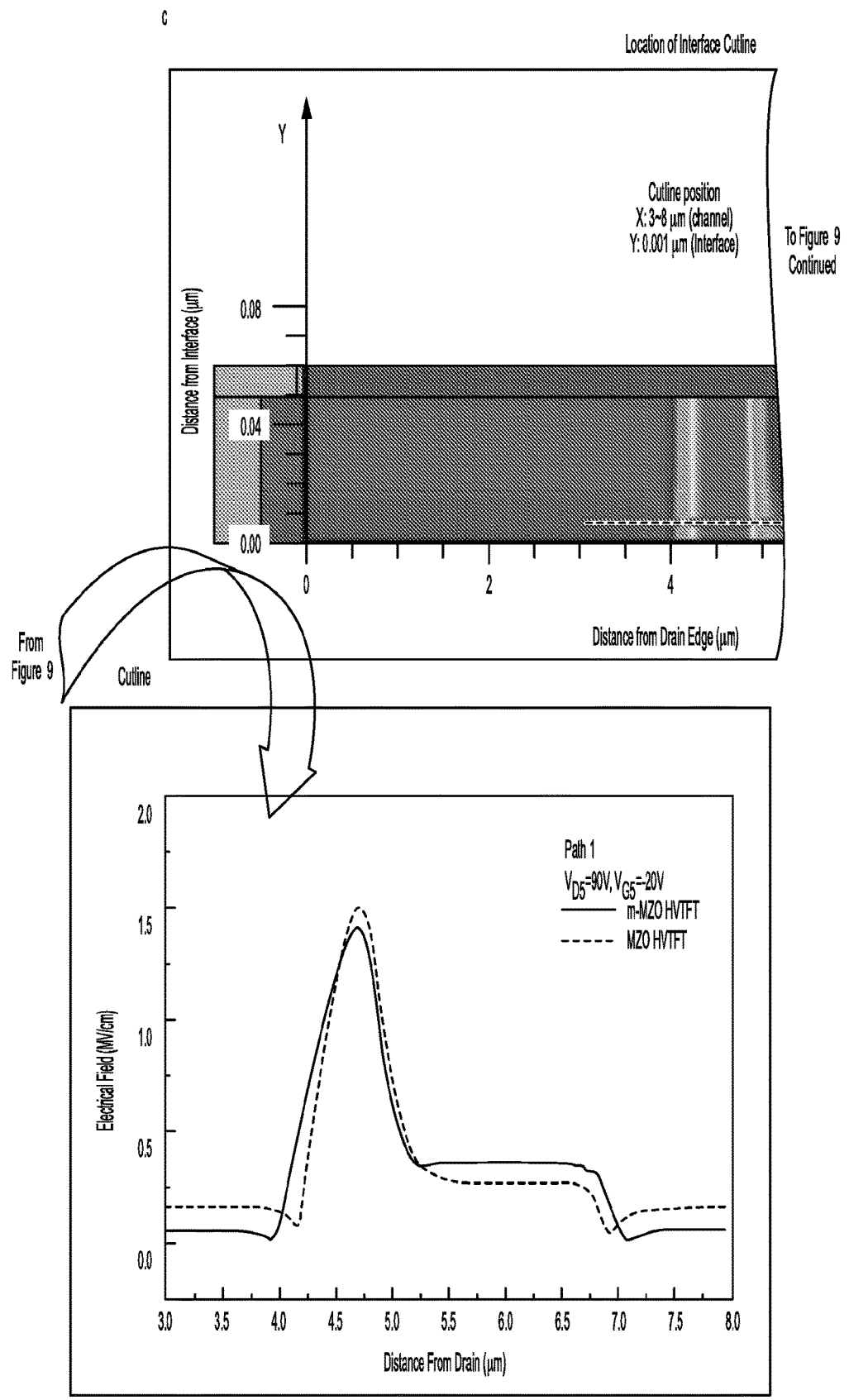
Figure 9:
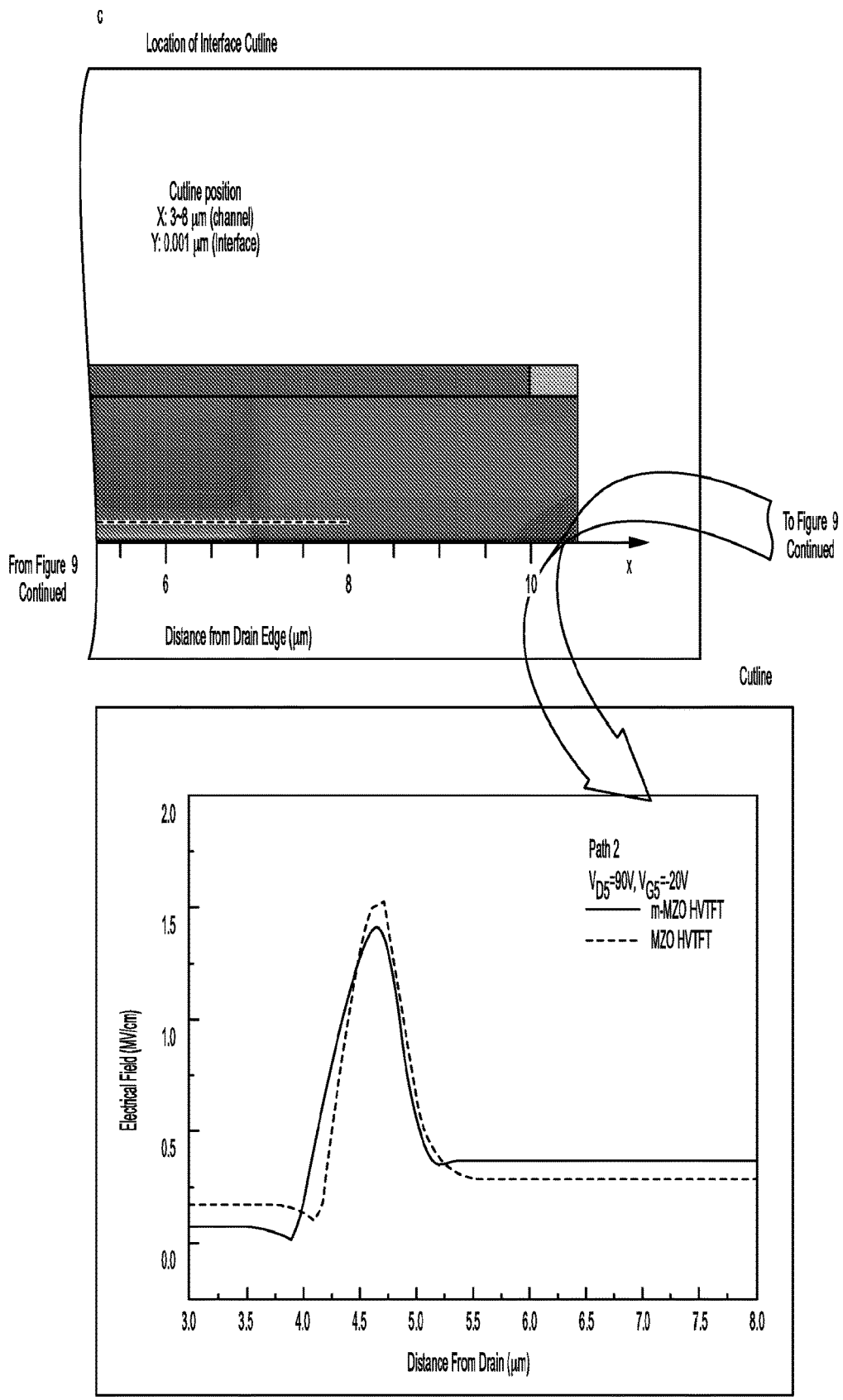

FIGS. 9(a)-(c) show simulation results of the electrical field distributions in the channel layers. The comparisons of electrical field distribution between MZO and m-MZO HVTFTs are presented for the configuration: (a) without the gate connection and (b) with the gate connection. (c) The location of 1D cutline and the comparison between m-MZO and MZO HVTFT along Path 1 and Path 2.

Figure 10:
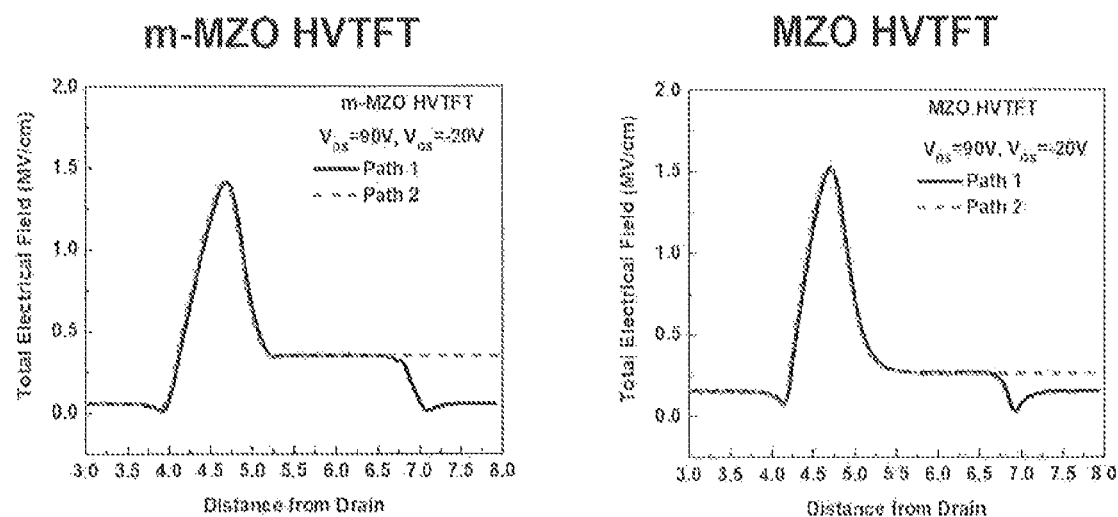

FIG. 10 shows the influence of the gate connection (Path 1: without the gate connection; Path 2: with the gate connection) to the electrical field distribution at the interface cutlines of m-MZO and MZO HVTFTs.

Figure 11:
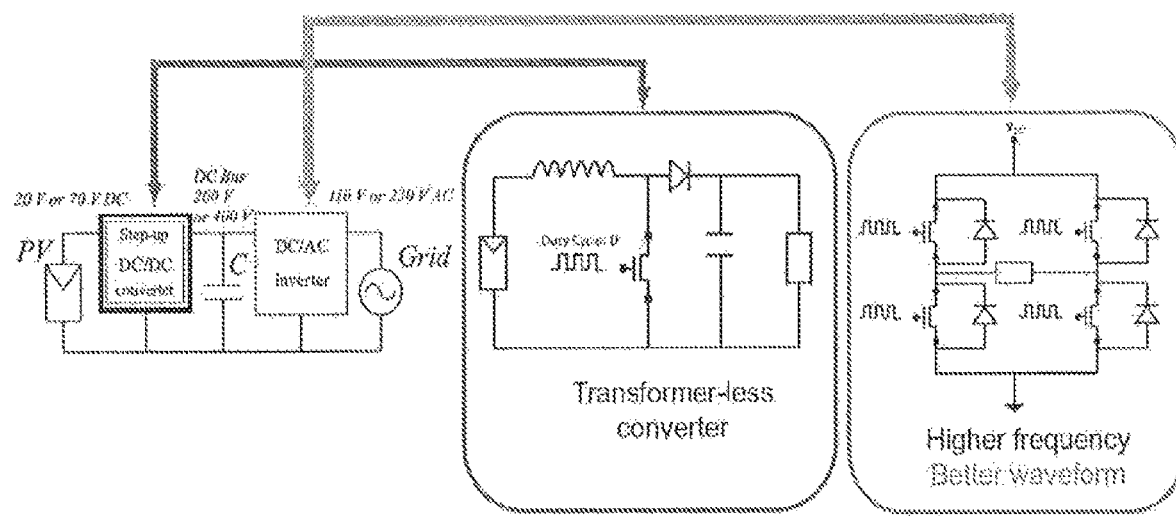

FIG. 11 illustrates a schematic of the power management for PV-SOG, where the DC/DC converter and DC/AC inverter incorporating the high voltage transistor of the present invention.

DETAILED DESCRIPTION OF THE INVENTION

Various embodiments of the invention provide a semi-transparent and fully transparent MZO high voltage TFT (MZO HVTFT) on glass without using an expensive and toxic indium-based oxide semiconductor material such as IGZO. This MZO HVTFT on glass technology opens a new micro-inverter technology for broad applications. Among the many advantages of the new technology are low cost of materials (substrate and device) and fabrication process, improved device characteristics and high voltage blocking capability, improved energy efficiency, improved thermal and NBS stability, and easy incorporation into various components and systems on glass that require high voltage devices, including inverters in PV-SOG and self-powered smart glass.

While the following text may reference or exemplify specific components of a device or a method of utilizing the device, it is not intended to limit the scope of the invention to such particular references or examples. Various modifications may be made by those skilled in the art, in view of practical and economic considerations, such as the size of an individual component and the process of manufacturing. Furthermore, as noted above, although in the illustrated embodiments specific ranges are disclosed, for example film thickness and doping level, and specific materials (gate dielectric, metallization schemes of gate, source, and drain, etc) and characteristics are described, it should be noted that such ranges, values, materials, and characteristics are merely illustrative for achieving a desired performance. As application and performance criteria change, other ranges, materials, and characteristics may be substituted, as known by those familiar with this technology.

The articles "a" and "an" as used herein refer to "one or more" or "at least one," unless otherwise indicated. That is, reference to any element or component of the present invention by the indefinite article "a" or "an" does not exclude the possibility that more than one element or component is present.

The term "about" as used herein refers to the referenced numeric indication with a reasonable scale, for example plus or minus 10% of that referenced numeric indication.

An aspect of the invention provides a Magnesium zinc oxide-based high voltage thin film transistor (MZO-HVTFT). The MZO-HVTFT includes a substrate, a ring-shaped gate over the substrate, a circular dielectric insulating layer deposited and patterned over the gate, a $Mg_yZn_{1-y}O$ transition layer (MZO-TL) over the dielectric insulating layer, a channel layer containing Magnesium zinc oxide deposited and then patterned over the insulating layer, and a source and a drain concentric with the gate electrode over the channel. Further, a passivation layer is disposed on a top surface of the channel layer to protect the MZO HVTFT from ambient influence.

The dielectric insulating layer is made from a material including for example, $SiO_2$, $Al_2O_3$, $HfO_2$, AlN, and any combination thereof. The dielectric insulating layer can also be configured to contain a stack structure formed by a plurality of layers which contain the above materials.

In the illustrated embodiments, the channel layer contains $Mg_xZn_{1-x}O$ wherein the Mg composition value x is limited in a range of ($0 < x \leq 0.05$). The traditional TFTs using the pure ZnO (x=0) as a channel suffer from the stability issues including the threshold voltage shift and thermal instability, which would hinder its use as an inverter. By introducing a proper amount of Magnesium (Mg) into ZnO to form ternary $Mg_xZn_{1-x}O$ (MZO) ($0 < x \leq 0.05$) as the TFT channel material, oxygen vacancy in the channel layer is suppressed. Concomitantly, a small amount of Mg in MZO will not introduce the significant alloy scattering and disorder. Therefore MZO with the proper Mg composition as the channel layer keeps the high electron mobility of ZnO material, however overcomes the instability issues accompanied with pure ZnO.

In the illustrated embodiments, the channel layer is not in direct contact with the gate dielectric insulating layer. A transition layer containing $Mg_yZn_{1-y}O$ ($x \leq y \leq 1.0$) is incorporated between the channel layer and the gate dielectric insulating layer, where y is continuously decreased from 1.0 (MgO) at the interface with the insulating layer to the x at the interface with the $Mg_xZn_{1-x}O$ (MZO) ($0 < x \leq 0.05$) channel layer. The addition of such a transition layer significantly improves the subthreshold slope and on-current values. More importantly as shown in the examples, it enables higher blocking voltage with a high on/off ratio, and a higher operating voltage than conventional TFTs.

The HVTFT has the unique design with the circular shape: the channel, drain and source all have concentric circular shape. This design minimizes non-uniform electrical field distribution as seen in traditional rectangular channel and improves the blocking voltage of the MZO-HVTFT.

The transition layer serves as a barrier against Zn diffusion so the interface states and trapped charges are reduced. This improvement leads to the decrease of the maximum electrical field near the channel-gate dielectric interface, resulting in the increase of blocking voltage. Preferably, the magnesium zinc oxide in the transition layer has a decreasing gradient of zinc from the interface with the insulating layer to the interface with the channel layer.

The electrode can be transparent contact electrodes containing transparent conductive oxides. Suitable oxides include, but not limited to the Ga-doped ZnO (GZO), Al-doped ZnO (AZO), Flourine-doped Tin Oxide (FTO), and any combination thereof. The ring-shape bottom gate, the circular drain contact, the ring-shape source contact are preferably highly conductive electrodes with low-contact resistivity.

The thickness of the transition layer is designed in the range from about 5 nm to about 15 nm. It is thick enough as the diffusion barrier to suppress the Zn diffusion; however, it is also thin enough to assure the sufficient on-current value. There is a trade-off between blocking capability and driving capability in the MZO HVTFT. As the channel length increases, the blocking voltage increases; however, the on-current drops. The channel length L, which is defined by the space between source and the drain is designed to be for example, about 5 to about 30 μm.

Figure 1:
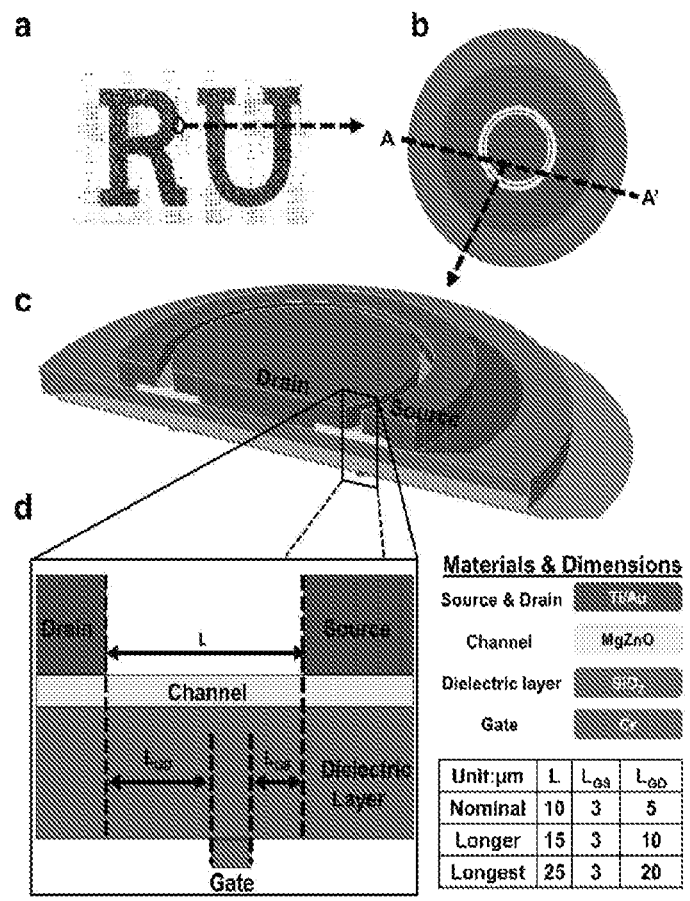
FIGS. 1(a)-1(d) show the overview of the structures of HVTFTs. (a) A photograph displays the HVTFTs on a transparent glass substrate. Schematic diagrams of an MZO HVTFT with a ring structure are shown: (b) the top view and (c) the three-dimensional cross-sectional structure along A-A' in (b), and (d) the dimensions and structure of a single HVTFT device.

A ring as an offset is defined between the edge of the drain and the closest edge of the gate as shown in FIG. 1. A first offset distance ($L_{GD}$) is defined as the distance between the edge of the drain and the closest edge of the gate. Similarly, a second offset is defined between the edge of the source and the adjacent edge of the gate. A second offset distance ($L_{GS}$) is defined as the distance between the edge of the source and the closest edge of the gate. The gate of HVTFT is designed as not being centered below the channel as the conventional TFT. The gate-drain offset region $L_{GD}$ is longer than the gate-source offset region $L_{GS}$. This design meets the HVTFT's standard bias condition, wherein the high voltage bias is added on the drain terminal. Therefore, larger gate-drain area is needed to sustain high voltage bias. In some embodiments, the gate and drain offset $L_{GD}$ is designed to be in the range of 3 to about 25 m. The offset distance between the gate and source $L_{GS}$ ranges from about 2 to about 5 m. In some embodiments, the gate electrode, the source and the drain are arranged in a concentric alignment.

In some embodiments, the substrate is a transparent material such as glass. In some embodiments the substrate can be disposed on a structural component of a building such as a tile, a roof, or a wall. Alternatively, the substrate can be incorporated into a tile, a roof or a wall for BIPV. Another aspect of the invention provides an article of manufacture containing the MZO-HVTFT described herein. Advantages of the HVTFT of the present invention include low cost materials and manufacturing, high blocking voltage (over 600V), improved energy efficiency, improved thermal stability and NBS stability, easy incorporation into various instruments or systems requiring transparent circuitry able to operate at high voltage.

Inverters based on present HVTFT can be integrated with a solar module to form a transparent solar PV system on glass (PV-SOG). Transparent inverters also makes a solar PV system more scalable and make PV-SOG exterior appearance friendly, therefore, it could be a strong candidate for the building integrated photovoltaics (BIPV). Unlike the conventional solar panel which is separately installed on roofs after completion of the building, BIPV serves as building elements so that the appearance of houses won't be compromised due to the post-installation of the solar panels.

The transparent PV-SOG can also be integrated with self-powered smart glass technology, such as windows and windshield of automobiles, and it won't affect the safety, appearance just like BIPV. This solar unit can serve as backup battery for emergency and energy source for other system, such entertainment, GPS navigation, etc.

In addition to the PV-SOG, MZO based HVTFT also opens the opportunities for other high voltage applications such as high speed printers and digital radiology instruments. HVTFTs are used to modulate high voltages required to initiate air discharges in an electro-graphic printer. With the feature of the high operating voltage, the MZO based HVTFTs can be utilized in high-speed printers for both portable and non-mobile applications.

Digital radiology is another important application of HVTFT. For example, in flat-panel x-ray imaging systems, a high voltage potential is built by the sensing layer, such as ZnO or amorphous-Si layers, and the regular TFTs easily burn down at such voltage range. ZnO has superior radiation hardness. Thus, the MZO based HVTFTs not only operate at high voltage but also have great radiation hardness from intrinsic characteristics, so they can be used in the readout circuit even without extra protection. Also, the detecting system can be integrated just like PV-SOG, so it is possible to build a portable self-scan X-ray detector system, including a pixel electrode for charge collection, a capacitor for charge storage, and a HVTFT circuit for image readout. This X-ray detector can be used in different areas, such as medical radiology and space technology.

The HVTFT described herein may also be incorporated into portable electronic systems and equipment such as generators for outdoor activities.

Another aspect of the invention provides a method of manufacturing the MZO-HVTFT described herein. The method generally includes the steps:
(a) depositing and patterning a ring-shaped gate electrode on a substrate;
(b) depositing and patterning a circular dielectric insulating layer over the gate electrode;
(c) depositing and patterning a circular $Mg_yZn_{1-y}O$ transition layer (MZO-TL) over the dielectric insulating layer;
(d) depositing and patterning a $Mg_xZn_{1-x}O$ (MZO) ring-shaped channel layer over the $Mg_yZn_{1-y}O$ transition layer (MZO-TL) so as to be concentric with the gate electrode;
(e) depositing and patterning a circular electrode over the channel layer so as to be concentric with the gate electrode to serve as the drain for the MZO HVTFT;
(f) depositing and patterning a ring-shaped electrode over the channel layer so as to be concentric with the gate electrode to serve as the source for the MZO HVTFT; and
(g) depositing and patterning a passivation insulating layer over the MZO HVTFT to passivate the device.

The $Mg_yZn_{1-y}O$ transition layer (MZO-TL) and the $Mg_xZn_{1-x}O$ (MZO) channel layer are formed through sequential deposition of controlled Mg doping. Further, $0<x\leq0.05$; and $x\leq y\leq1$.

The passivation layer is made from a material including for example, doped and undoped $SiO_2$, $Si_3N_4$, MgO, $Al_2O_3$, AlN, and any combination thereof, to protect the HVTFT from ambient influences (contaminants and moisture) and mechanical scratch.

The passivation layer is formed by using deposition technology, for example CVD, MOCVD, ALD, sputtering, spin-on-glass, or any combination thereof.

The magnesium zinc oxide transition layer (TL) $Mg_yZn_{1-y}O$ and the channel layer $Mg_xZn_{1-x}O$ can be deposited by various methods. In some embodiments, the channel layer and the transition layer can be deposited using metal organic chemical vapor deposition (MOCVD), wherein DeZn (diethyl zinc) and MCp2Mg (bis(methylcyclopentadienyl)magnesium) are used as the precursors for Zn and Mg, respectively. A modulation doping technique, where the Mg composition is continuously tuned to achieve a Mg composition change from y=1.0 (MgO) at the interface with the dielectric layer to y=x at the interface with the $Mg_xZn_{1-x}O$ ($0<x\leq0.05$) channel layer.

Each step can be achieved by using a procedure including, for example, Metalorganic Chemical Vapor Deposition (MOCVD), pulsed laser deposition (PLD), atomic layer deposition (ALD), multi-target sputtering techniques, and any combination thereof.

EXAMPLE

Material Preparation and Device Fabrication Process

The HVTFTs were fabricated on 0.4 mm thick commercial glass substrates. A 50 nm chromium (Cr) layer was deposited by sputtering, then patterned using a dry etching process to serve as the bottom gate electrode. Then, a 200 nm $SiO_2$ layer was deposited by plasma enhanced chemical vapor deposition (PECVD) as the gate dielectric layer. Following the $SiO_2$ deposition, the channel was deposited using metal organic chemical vapor deposition (MOCVD) at 400° C. DeZn (diethyl zinc) and MCp2Mg (bis(methylcyclopentadienyl)magnesium) were used as the precursors for Zn and Mg, respectively. Three types of channel layers (thickness of 50 nm) were deposited on $SiO_2$: (i) pure ZnO, (ii) $Mg_{0.03}Zn_{0.97}O$ (MZO), and (iii) modulation-doped $Mg_{0.03}Zn_{0.97}O$ (m-MZO). In the m-MZO HVTFT, a 10 nm modulation-doped $Mg_yZn_{1-y}O$ transition layer (MZO-TL) was inserted between the $Mg_{0.03}Zn_{0.97}O$ (MZO) channel layer and the $SiO_2$ dielectric layer, and the Mg composition (y) in the TL decreases from the side adjacent to $SiO_2$ (y=1) to the other side adjacent to the channel (y=0.03). The source and drain metallization (100 nm titanium (Ti)/50 nm gold (Au)) was deposited using electron beam evaporation, followed by a normal lift-off process. A photoresist film was coated on top of the TFT channel, serving as a passivation layer to prevent ambient absorption/desorption during electrical testing. HVTFTs with three different channel lengths are listed in the table of FIG. 1d. The channel lengths/gate-to-drain offset lengths are 10/5 µm, 15/10 µm, and 25/20 µm for nominal, longer, and longest HVTFT, respectively. The gate-to-source offset is kept the same of 3 µm.

Device Testing Conditions

The electrical measurements under the low bias were conducted using an HP-4156C with an HP-41501B Pulse Generator. With the boost from the connection of a pulse generator, the maximum voltage of the HP-4156C electrical testing system was limited to be 200V. The system which had a current resolution of $1\times10^{-15}$ A was used for all transfer characteristics. For electrical measurements under high bias, a high voltage testing system was built based on a Tektronix 370 with the probe station. As the current resolution of Tektronix 370 only reached $1\times10^{-6}$ A, it was only used for the testing of blocking voltages. In order to avoid problems with arcing and tracking due to environmental conditions, the devices were immersed in Fluorinert FC-40 during the high voltage measurements. The electrical measurements at different temperatures were conducted using an Agilent 1500B. All measurements were conducted in a light-tight probe station.

Material Characterizations

The samples used in the material analysis were prepared under the same device process except that the materials samples did not go through patterning and metallization processes. The structural and interfacial properties were analyzed using JEOL 2100F Field Emission Lorentz Transmission Electron Microscopy (TEM), Energy-dispersive X-ray spectroscopy (EDS), and X-ray photoelectron spectroscopy (XPS). The TEM samples were prepared by using a FEI HELIOS 600 Dual Beam Focus Ion Beam (FIB).

Device Design

The regular TFT has a rectangular channel. For an HVTFT, such a design would introduce non-uniform electrical field distribution with the highest field located at the corners of the channel, which limits the blocking voltage of the devices. To solve this problem, a circular ring structure was designed as shown in FIG. 1. The electrical field distributions of the ring and the rectangular structures are included in the supporting information. From the comparison between these two configurations, it can be seen that the field distribution from drain to source in the ring structure is much more uniform and the highest field is ~50% less than in the rectangular counterpart. The HVTFT has a bottom gate inverted-staggered configuration, and it includes two offset regions: gate to drain and gate to source, respectively. For comparisons, three types of materials were deposited on a $SiO_2$ dielectric layer, serving as the channel layer with a thickness of 50 nm: (i) pure ZnO, (ii) $Mg_{0.03}Zn_{0.97}O$ (MZO), and (iii) $Mg_{0.03}Zn_{0.97}O$ plus a modulation-doped thin layer (m-MZO). In the m-MZO HVTFT, a modulation-doped 10 nm $Mg_yZn_{1-y}O$ transition layer (MZO-TL) is inserted between the MZO channel layer and the $SiO_2$ dielectric layer, and the Mg composition (y) in the $Mg_yZn_{1-y}O$ TL decreases from the side adjacent to $SiO_2$ (y=1) to the other side adjacent to the channel (y=0.03).

Transfer Characteristics and Thermal Stability

Figure 2:
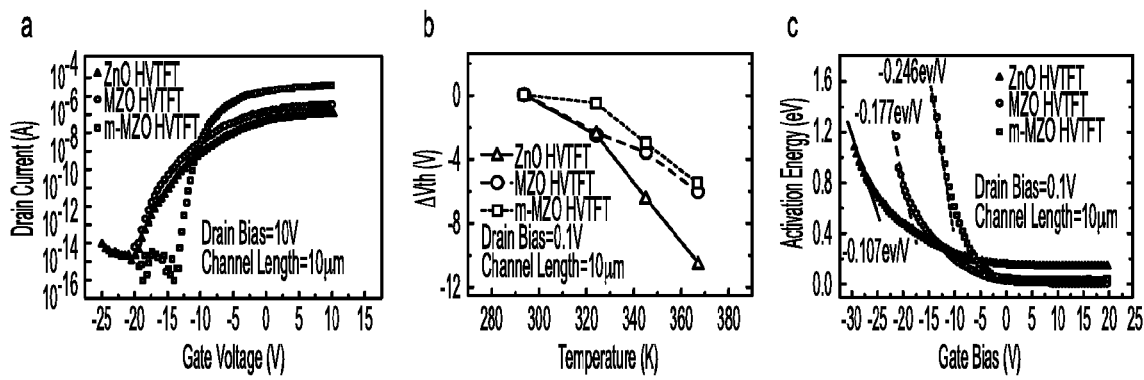
FIGS. 2(a)-2(c) show the electrical performances of HVTFTs. (a) Transfer characteristics of ZnO, MZO and m-MZO HVTFTs with $V_{DS}$=10V. (b) The shift of threshold voltage of HVTFTs at different temperatures. (c) The extracted activation energy of drain current as a function of gate bias in HVTFTs.

The transfer characteristics of HVTFTs with three different channel materials and structures are shown in FIG. 2a. Compared with ZnO HVTFT, MZO HVTFT shows a better subthreshold slope (S.S.) and on-current. The most significant improvement of the MZO over the pure ZnO channel layer is in its thermal stability, which is one of the critical requirements for high voltage devices being integrated into PV-SOGs. By measuring the transfer characteristics of HVTFTs at different temperatures, the shifts of threshold voltage ($V_{th}$) are compared in FIG. 2b. As temperature increases from 294 K (room temperature) to 367 K, MZO HVTFT only shows a threshold voltage shift $\Delta V_{th}$ of −6 V in comparison to $\Delta V_{th}$ of −10.5 V in the pure ZnO counterpart. This negative shift of threshold voltage at higher temperatures results from the thermally activated electrons from the trap states located in the channel and in the interface between the channel and gate dielectric $SiO_2$.

In FIG. 2c, the activation energy of drain currents at different gate biases is extracted from the Arrhenius plot (ln $I_D$ vs. $T^{-1}$):

$$I_D = I_{D0} e^{-E_a/k_B T} \quad (1)$$

where $I_{D0}$ is the drain current constant, $k_B$ the Boltzmann constant, T the temperature in Kelvin, and $E_a$ the activation energy of drain current.

If the trap density in TFT is high, the moving rate of the Fermi level with respect to the gate bias from the deep level to the conduction band is roughly inversely proportional to the total trap density. The steeper falling rate (0.177 eV/V) of the MZO HVTFT, as opposed to that of the ZnO HVTFT (0.107 eV/V), indicates that the MZO TFT has a lower trap density. Because both MZO and ZnO HVTFTs are fabricated on the same $SiO_2$ gate dielectric layer, the interface trap densities of the two devices are similar. Therefore, the improvement of thermal stability in MZO HVTFT over ZnO HVTFT is mainly attributed to the reduction of traps in the bulk channel. In fact, the Mg—O has a stronger bonding than Zn—O, resulting in the lower density of oxygen vacancy in the MZO channel than that of the pure ZnO channel.

In the comparison between MZO HVTFT and m-MZO HVTFT, it was found that the later shows an order higher of on-current and a steeper S.S. than the MZO counterpart. The steepest falling rate (0.246 eV/V) of the activation energy of the drain current suggests a nearly 40% lower total trap density in m-MZO HVTFT than in MZO HVTFT. Since both of MZO and m-MZO HVTFTs are made up of the same MZO channel and SiO$_2$ gate dielectric layer, these differences in characteristics between the two HVTFTs mainly result from the different interface properties between the channel and gate dielectric layer. Specifically, the unique interface design and engineering using modulation doping of Mg in m-MZO HVTFT reduces the interface trap density. Therefore, the total trap density in m-MZO HVTFT is lower than in the MZO HVTFT.

Mg$_y$Zn$_{1-y}$O transition layer (MZO-TL) as a diffusion barrier

Figure 3:
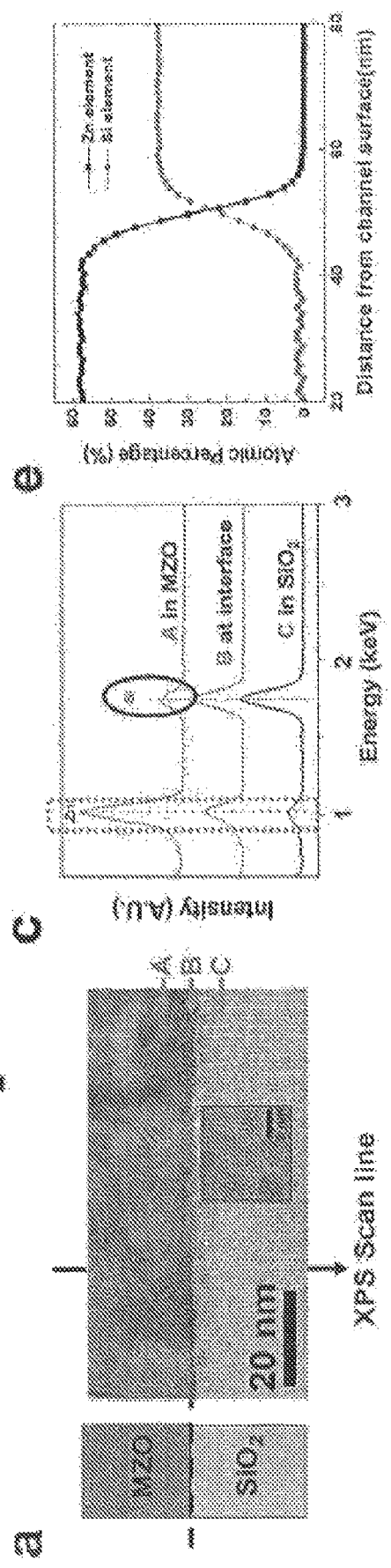
FIGS. 3(a)-3(f) show the material characterization near the interfaces. TEM images of the interfaces between the channel layer and the $SiO_2$ dielectric layer (a) without a transition layer (for MZO HVTFT) and (b) with a modulation doped transition layer (for m-MZO HVTFT). The inset of FIG. 3(a) features the gray dots found in the $SiO_2$ layer in the MZO sample. EDS spectra of Zn, Mg and Si elements at the different locations (marked in the TEM images) across the channel—gate dielectric interface for (c) MZO and (d) m-MZO samples. Depth profiles of atomic percentage of Si, Zn, and Mg from XPS measurements of (e) MZO and (f) m-MZO samples along the scan lines shown in the TEM pictures. The oxygen profile is not included.

To understand the effect of the MZO-TL on improving the properties of the interface between the channel and gate dielectric layer, the cross sections of HVTFTs prepared by a Focus Ion Beam (FIB) were studied using a transmission electron microscopy (TEM). FIGS. 3a and 3b show the images of the interface regions in MZO and m-MZO HVTFT samples, respectively. As shown in the inset of FIG. 3a, the gray dots are observed only in the SiO$_2$ dielectric layer of the MZO HVTFT sample. To identify these dots, energy-dispersive X-ray spectroscopy (EDS) was used to analyze the elemental composition of the films at different positions (point "A" to "F") across the interface. As shown in the dashed box of FIG. 3c, the Zn peak in MZO HVTFT appears not only in the MZO channel area (point A) but also near the interface (point B) and even inside the gate dielectric SiO$_2$ layer (point C). The EDS results further confirm that the observed gray dots are related to the Zn element. Moreover, in the EDS spectrum, there is a Si peak marked by the "circle" in the MZO area (point A), The results indicate the interdiffusions which occur across the interface (point B): Zn diffuses from the MZO layer into SiO$_2$ while Si diffuses from the SiO$_2$ layer into the MZO layer. In contrast, for m-MZO HVTFT, as shown in the dashed box of FIG. 3d, the Zn peak appears in the MZO area (point D), only a tiny peak appears near the interface (point E), but no Zn peak is observed inside the SiO$_2$ layer (point F). On the other hand, as shown in the circle, there is no Si peak detected in the MZO area (point D). Therefore, the modulation-doped thin transition layer inserted between the MZO and SiO$_2$ acts as a diffusion barrier, which hinders Zn and Si diffusion across the interface between the channel and gate dielectric layer.

X-ray photoelectron spectroscopy (XPS) was used to estimate the atomic percentages of different elements in the interface regions. The depth profiles were obtained by using the in-situ sputtering process. FIGS. 3e and f show depth profiles of atomic percentages of Si, Zn, and Mg of the MZO and the m-MZO HVTFT, respectively. A small amount (3%) of Mg doping is barely shown inside the MZO channels in both of MZO and m-MZO HVTFT samples due to the detection limit of XPS. However, a narrow peak of Mg does appear in the m-MZO HVTFT, produced from the Mg$_y$Zn$_{1-y}$O transition layer (MZO-TL). In the MZO sample, Zn diffuses extensively into the SiO$_2$ layer as indicated by the length of overlapped XPS profiles of SiO$_2$ and MZO. In contrast, there is an abrupt interface with negligible overlapped profiles of Si and Zn in the m-MZO sample. TEM/EDS and XPS characterizations provide consistent results that the phenomenal interdiffusion between the SiO$_2$ gate dielectric layer and the MZO channel layer is only detected in the MZO HVTFT. The MZO-TL in m-MZO HVTFT acts as a diffusion barrier, which effectively blocks the interdiffusion of Zn from the MZO to SiO$_2$, as well as Si from SiO$_2$ to the MZO channel.

High Voltage Blocking Capability

Figure 4:
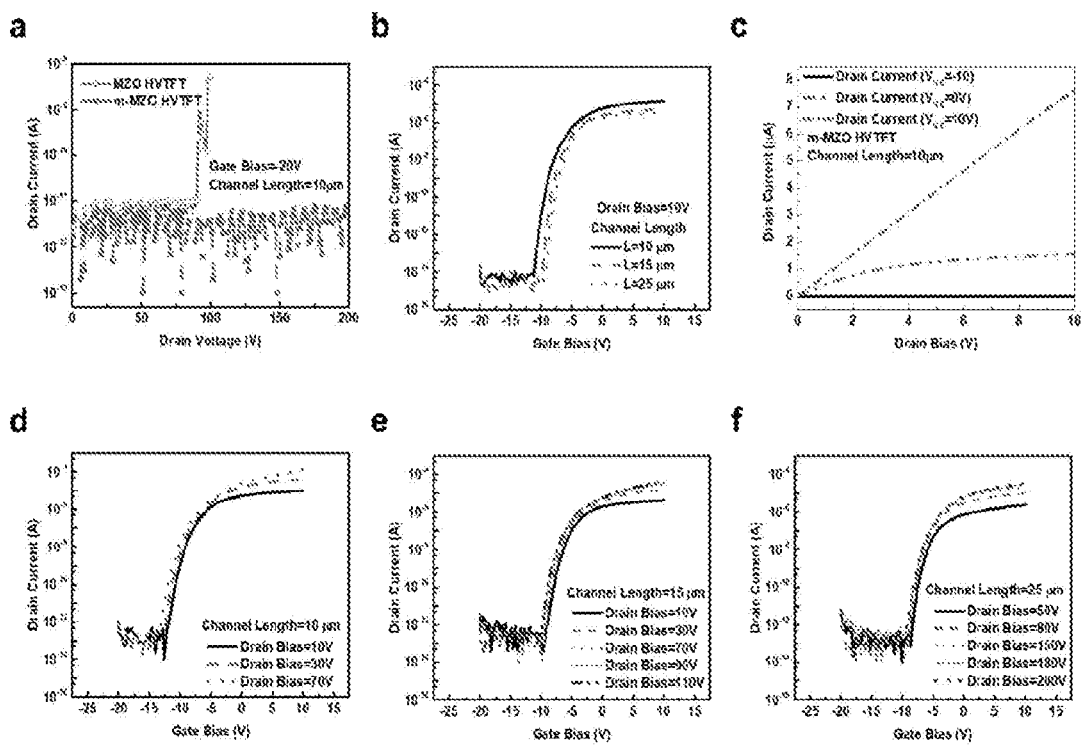
FIGS. 4(a)-(f) show the electrical performance at high bias conditions and the blocking capabilities of HVTFTs of HVTFTs. (a) drain leakage current of off state in MZO and m-MZO HVTFTs, (b) transfer characteristics of m-MZO HVTFTs with different channel lengths (The detailed dimensions of m-MZO HVTFTs are listed in the Table of FIG. 1d.), (c) the output characteristics of m-MZO HVTFT with a channel length L=10 am. (d), (e), (f) the transfer characteristics at high bias conditions of m-MZO HVTFTs with a channel length L=10, 15, and 25 μm, respectively.

Having the capability of blocking high voltages and operating at high bias conditions reliably are the essential characteristics for the application of high voltage transistors in PV inverters. Since ZnO HVTFT failed to show thermal stability, only comparison between MZO and m-MZO HVTFTs was made. The results of blocking voltages of MZO and m-MZO HVTFTs with the same channel length (L=10 μm) are shown in FIG. 4a. The drain leakage current of MZO HVTFT increases abruptly, and the device burns down at V$_{DS}$=90 V. In contrast, the drain leakage current of m-MZO HVTFT keeps as low as 10$^{-12}$ A even at much higher V$_{DS}$=200 V (here 200 V is the limitation of HP-4156C used for testing). A comparison of the transfer characteristics among three m-MZO HVTFTs with different channel lengths is presented in FIG. 4b. There is a trade-off between blocking capability and driving capability in m-MZO HVTFT. As the channel length increases, the blocking voltage increases; however, the on current drops. The values of the blocking voltage/on-current for the nominal (L=10 min), longer (L=15 min), and longest (L=25 μm) m-MZO HVTFT are 300 V/3.5×10$^{-5}$ A, 427 V/6.61×10$^{-6}$ A, and 609 V/4.57×10$^{-6}$ A, respectively. The output characteristics of m-MZO HVTFT of 10 μm are presented in FIG. 4c. It shows better saturation behavior at low gate bias. At high gate bias, the drain current increases as the drain bias increases. This kink effect was also observed in the IGZO HVTFT. It could be related to the channel length modulation induced self-heating effect. The m-MZO HVTFTs with channel length of 10, 15, and 25 μm have the highest operating drain bias of 70, 110, and 200 V as shown in FIGS. 4d, e and f, respectively. The maximum drain voltage without degrading the on-current defines the highest operating drain bias of each HVTFT, except for the case of 25 μm which only shows 200 V due to the limitation of the testing equipment. At these high drain bias conditions, all m-MZO HVTFTs show a high on/off ratio (more than), and the V$_{OFF}$ and off-current almost constant at any drain bias condition. The m-MZO HVTFT of 25 μm can operate at drain bias of 200V with a blocking capability over 600 V, suitable to be used as an inverter of PV-SOG.

Interface Engineering

The interface engineering using a modulation-doped thin MZO transition layer (MZO-TL) in the m-MZO HVTFT improves transfer characteristics of the device, thus enables high voltage blocking capability. Such improvements are mainly attributed to the prevention of Zn diffusion into the SiO$_2$ dielectric layer. Zn could diffuse as ions, such as Zn$^{2+}$ into the dielectric layer and then become the fixed charges in SiO$_2$. Because the positive Zn$^{2+}$ trapped inside SiO$_2$ would attract electrons, it requires an extra negative gate bias voltage to deplete the channel. As a result, MZO HVTFT, which has extra diffusion of Zn$^{2+}$ into SiO$_2$, has more negative Vow than m-MZO HVTFT does. Moreover, the out-diffusion of Zn from the MZO channel layer would generate Zn-related defects, such as Zn vacancies and Zn interstitials in the MZO channel layer, especially near the MZO/SiO$_2$ interface, thus degrading the electrical performance of transistors. The total trap density from the subthreshold slope (S.S.) can be estimated using the following $$S.S = \ln 10 \times \frac{k_B T}{q}\left(1 + q\frac{tN_{bulk} + D_{it}}{C_G}\right) \quad (2)$$

where q is the elementary electric charge, k$_B$ the Boltzmann constant, T the temperature in Kelvin, t the channel thickness, $N_{bulk}$ the bulk trap density, $D_{it}$ the interface trap density, and $C_G$ the capacitance per area of the gate dielectric layer ($C_G$ is $1.73 \times 10^{-4}$ F/m$^2$ and $1.69 \times 10^{-4}$ F/m$^2$ for MZO and m-MZO HVTFT, respectively. The theoretical values of SiO$_2$=3.9 and MgO=9.90$^{34}$ are used in estimation). The total trap density includes the bulk trap (t$N_{bulk}$) and the interface trap ($D_{it}$), which are calculated to be $2.14 \times 10^{12}$ cm$^{-2}$ and $8.36 \times 10^{11}$ cm$^{-2}$ for MZO and m-MZO HVTFT, respectively. Since the channel material is the same, the difference in the total charge density between HVTFT and m-HVTFT is approximately equal to the reduction of the interface trap density, which is $1.3 \times 10^{12}$ cm$^{-2}$. By adding a modulation doped transition layer into the m-MZO HVTFT, Zn diffusion into the SiO$_2$ dielectric layer is significantly suppressed. The interface engineering successfully adjusts the threshold voltage $V_{th}$ close to 0 V and makes the S.S. steeper than that of MZO-HVTFT.

Figure 5:
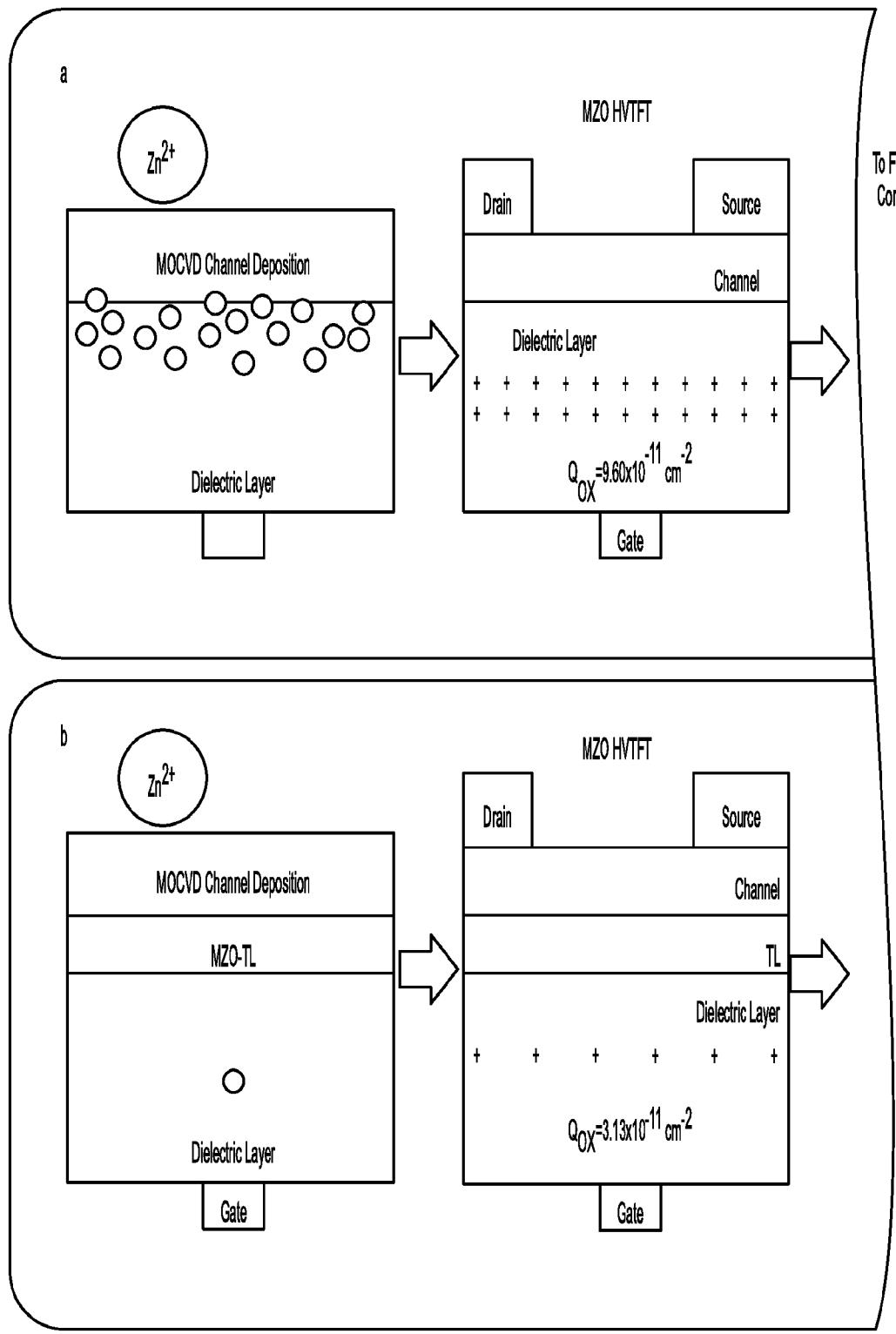
FIGS. 5(a)-(e) show the simulation of electrical field distribution in HVTFTs. Schematic diagrams of different interface designs and layer structures of (a) MZO and (b) m-MZO HVTFT, respectively. The SILVACO simulation results on two-dimensional distributions of the critical electrical field in the nominal (L=10 μm) channels of (c) MZO HVTFT and (d) m-MZO HVTFT, respectively. (e) A comparison of the critical electrical field of MZO HVTFT and m-MZO HVTFT. The cutline of the electrical field is near the interface of channel/gate dielectric and above the gate edge where the maximum electrical field locates.
Figure 5:
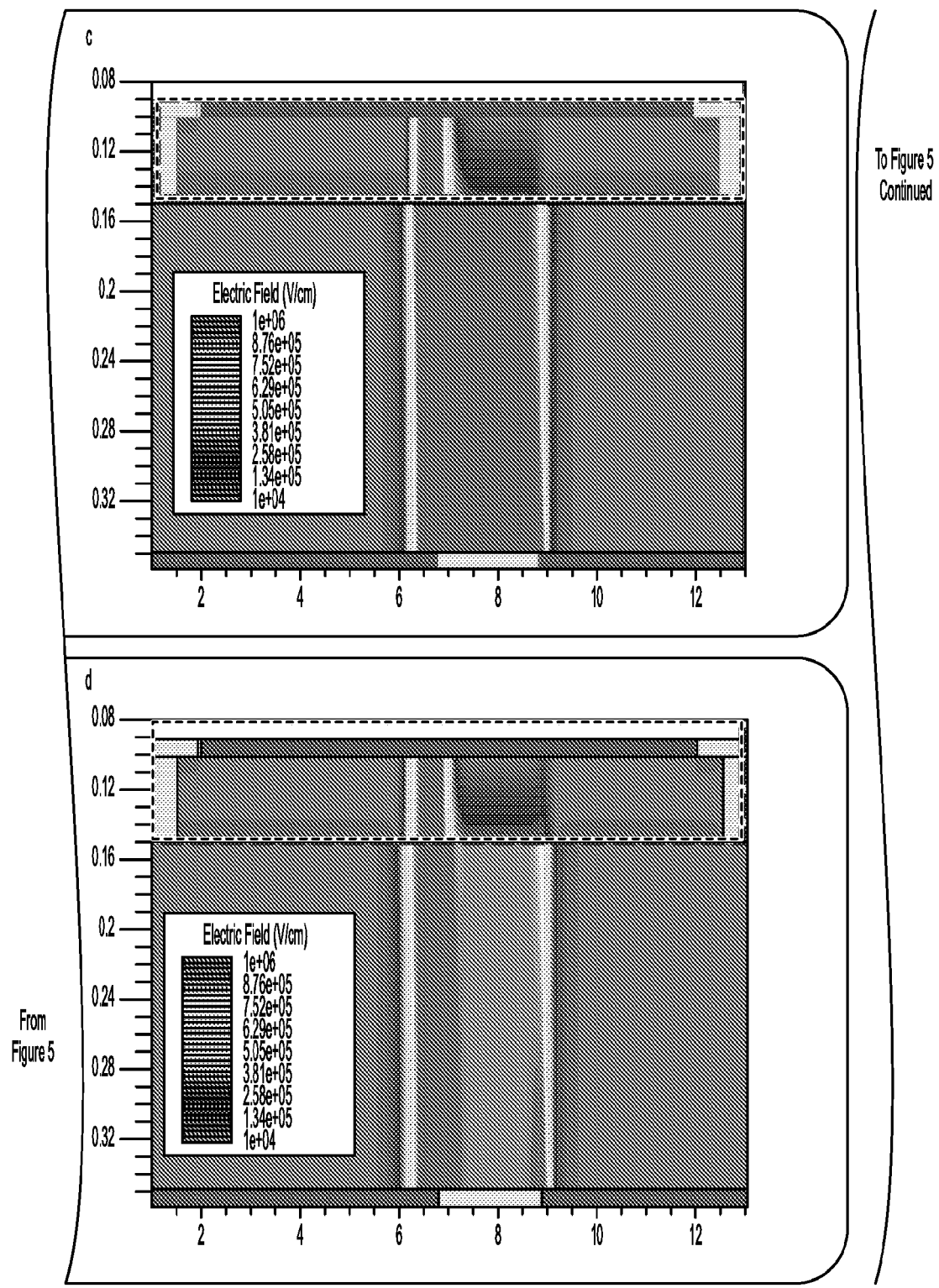
Figure 5:
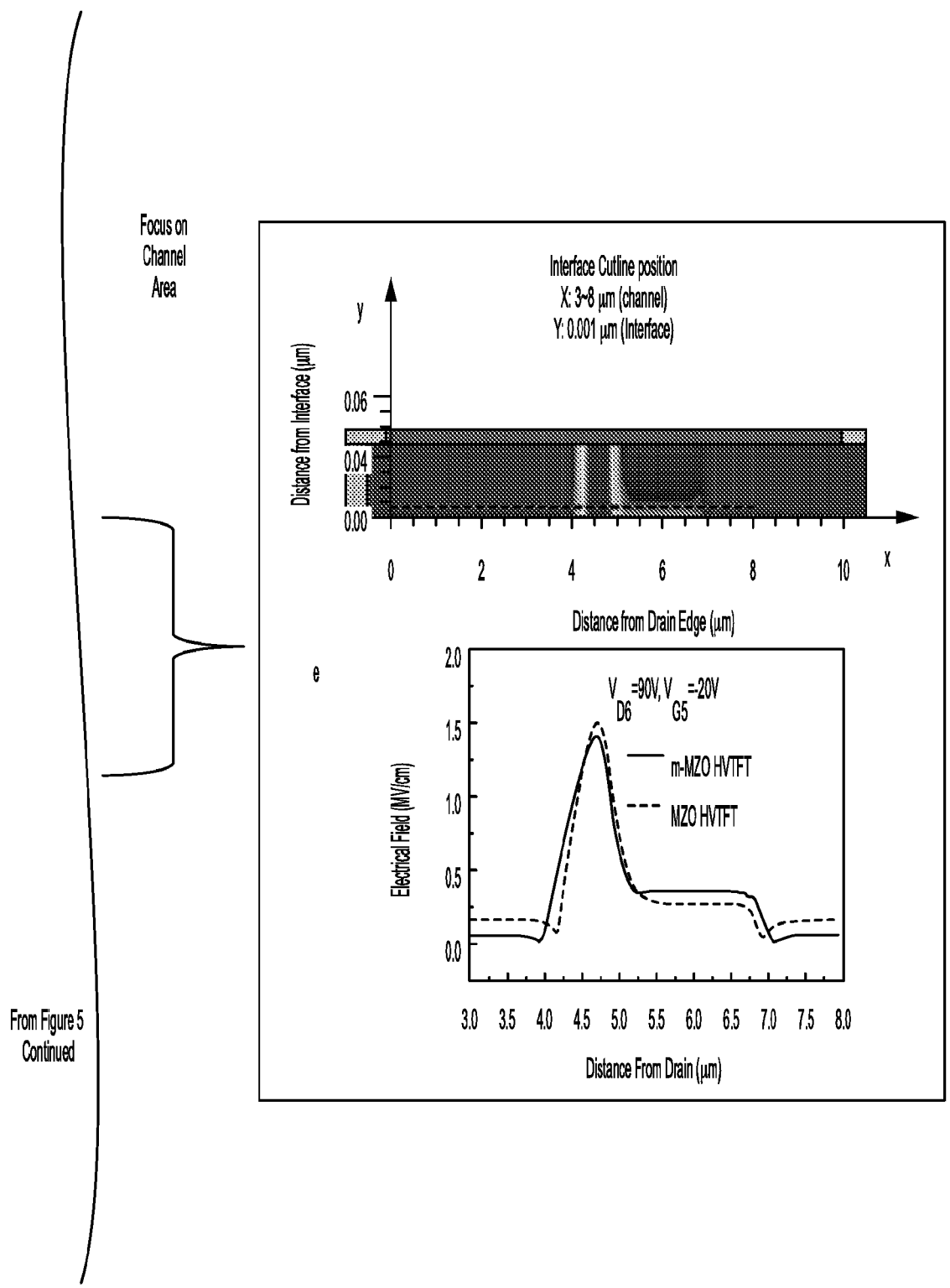

The addition of the MZO-TL also enables the higher blocking voltage. The ideal break-down field of a pure MgO is 12 MV/cm. Although the effective thickness of the dielectric layer increases by adding the MZO-TL, a 10 nm MZO transition layer can not provide more than 12 V of the blocking voltage. Furthermore, the gate leakage current keeps at a similar level in both HVTFTs after the breakdown at high drain bias. Therefore, the significant enhancement of the blocking voltage in m-MZO HVTFT cannot be attributed to the extra voltage drop on the MZO-TL. In order to understand the fundamental cause of the improvement in blocking voltage, SILVACO software was used to simulate the electric field distributions in the two different devices. As drawn in the FIG. 5a, MZO HVTFT possesses extra positive oxide charges in comparison to m-MZO HVTFT. The amount of the extra equivalent oxide charges per unit area (QOX) is estimated based on following equation:

$$Q_{OX} = -\Delta V_{OFF} \times C_G \quad (3)$$

where $C_G$ is the capacitance per area of the gate dielectric layer. The difference in $V_{OFF}$ between MZO and m-MZO HVTFT is around −6V, so the extra $6.47 \times 10^{11}$ cm$^{-2}$ of positive charges are placed in the MZO HVTFT. The impact of oxide charges near the interface on electrical field distribution in the device is shown in FIG. 5. The maximum values of the electrical field near the interface are 1,520 kV/cm, and 1,410 kV/cm for MZO and m-MZO HVTFT, respectively. The reduction of the maximum electrical field allows m-MZO HVTFT to operate at higher drain bias, enabling higher blocking voltage. Overall, the MZO-TL in m-MZO HVTFT acts as a barrier against Zn diffusion so the interface states and trapped charges are reduced. This improvement leads to the decrease of the maximum electrical field near the channel-gate dielectric interface, resulting in the increase of the blocking voltage.

Statistical Data of Electrical Performance

Figure 6:
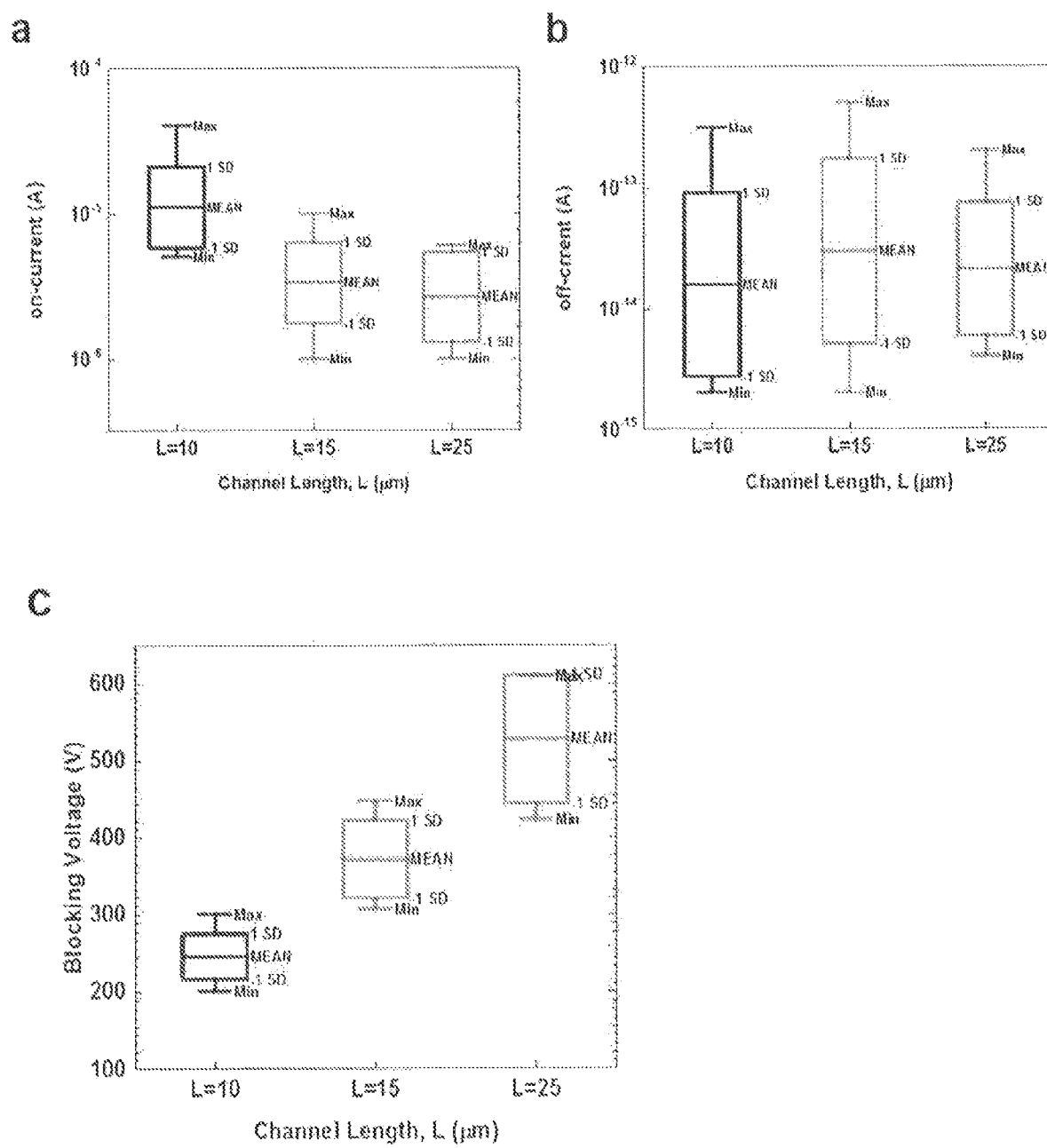
FIGS. 6(a)-(c) show statistic data of (a) on-current, (b) off-current, and (c) blocking voltage of the m-MZO HVTFTs with three different channel lengths (L=10, 15, and 25

The statistics of electrical performances of m-MZO HVTFTs are presented in FIG. 6 including (a) on-current, (b) off-current, and (c) blocking voltage. The data show the trade-off between blocking voltage and on-current; furthermore, such trade-off is directly affected by the offset length. The dominate factor of the variation in data is attributed to the device processing issues, especially the mask misalignment in the photolithorgraphy process of the ring-structures. Such variation could be suppressed by refining the photomask design and using a better alignment tool. It is noticed that the variation of the off-current (FIG. 6b) is larger than that of on-current (FIG. 6 a). This is due to much smaller values of the off-current which are close to the measurement limit of the instrument system.

Figure 7:
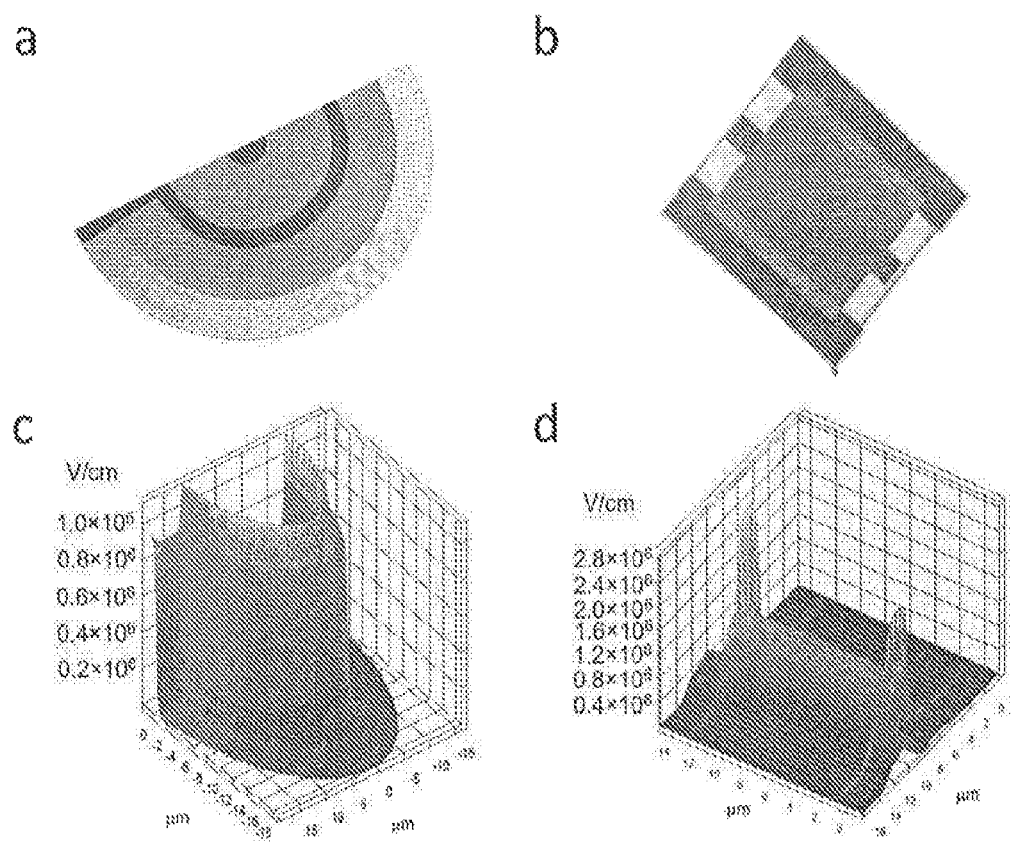

Simulation of Electrical Field Distribution (i) Comparison Between Circular and Rectangular Configurations SILVACO software was used to simulate the electrical field distribution in TFT devices with the circular (FIG. 7a) and rectangular (FIG. 7b) configurations, respectively. For comparison, the m-MZO HVTFTs with both configurations that have the equivalent channel length and offset region length are used in the simulation. As shown in FIG. 7d, at ON state of high voltage operation, the electrical field crowding occurs on the drain side around the corner of the rectangle where the maximum field reaches over 2,800 kV/cm. This becomes the weak point where the breakdown of TFT happens. On the contrary, the field distribution in the ring structure (FIG. 7c) is uniform from drain to source, and the highest field is 1,420 kV/cm, which is approximately 50% less than in the rectangular counterpart. It shows that the symmetric design of a ring structure removes the severe electrical field crowding around the corners of a rectangular channel. Therefore, the HVTFT with the ring structure is able to work at a higher bias voltage and offers a higher blocking voltage over the regular rectangular counterpart.

(ii) Comparison Between MZO HVTFT and m-MZO HVTFT

In the circular-ring configuration, a contact pad is needed to connect the gate as shown in FIG. 8a. The electrical field in the gate connection area is different from the other area in the ring. In order to analyze the influence of the gate connection, the simulation was also conducted for the area with the gate connection. As shown in the FIG. 8b, the "Path 1" is the majority of areas without the gate connection, and the "Path 2" is the area with the gate connection. The cross-section view of structures of the "Path 1" and "Path 2" are shown in FIG. 8c. The electrical field distributions in "Path 1" and "Path 2" in MZO HVTFT and m-MZO HVTFT are simulated and the results are presented in FIG. 9. In both "Path 1" (FIG. 9a) and "Path 2" (FIG. 9b) regions, m-MZO HVTFTs show the lower maximum electric field than that of MZO HVTFTs. It indicates that the transition layer enables to reduce the peak electrical field in the devices with the gate connection.

The effects of the gate connection on the electrical field of HVTFTs along the cutlines are shown in the FIG. 10. For both of m-MZO and MZO HVTFTs, the distribution and maximum value of electrical fields in the path 1 and 2 are almost the same. The major difference is the electrical field in the gate-source offset region. In the path 1, the electrical field drops quickly; on the contrary, in the path 2 the electrical field is constant in whole gate-source offset region.

Definition of Electrical Parameters in Exemplary Embodiments

The threshold voltage ($V_{TH}$) is defined as the gate voltage value when a drain current ($I_{DS}$) reaches $10^{-9}$ A with $V_{DS}$=0.1V.

The turn-off voltage ($V_{OFF}$) is defined as the gate voltage value when a drain current ($I_{DS}$) reaches $10^{-13}$ A with $V_{DS}$=10V.

The subthreshold slope (S.S.) is extracted from a 3-decades range in the subthreshold region of the $\log_{10}(I_{DS})$ vs $V_G$ curve with $V_{DS}$=10V:

$$S.S. = \left[\frac{\partial \log_{10}(I_{DS})}{\partial V_G}\right]^{-1} \quad (4)$$

The on-current (Ion) is the drain current while a TFT operates at VGS=10V and VDS=10V.

The on/off ratio is obtained by comparing between the on-current and the lowest current within the gate bias range of −25V to 10V.

The blocking voltage is defined as the highest drain bias that a TFT can sustain without a breakdown in the OFF state.

The shifts of threshold voltage in the thermal stability measurement $$\Delta V_{TH}(ZnO,T)=V_{TH}(ZnO,T)-V_{TH}(ZnO,300K) \quad (5)$$

$$\Delta V_{TH}(MZO,T)=V_{TH}(MZO,T)-V_{TH}(MZO,300K) \quad (6)$$

$$\Delta V_{TH}(m\text{-}MZO,T)=V_{TH}(m\text{-}MZO,T)-V_{TH}(m\text{-}MZO,300K) \quad (7)$$

Extracted Electrical Parameters of HVTFTs

TABLE 1

Electrical characteristics of ZnO, MZO, and m-MZO HVTFTs with the equivalent channel length L = 10 μm:

| HVTFT Devices | on/off Ratio | $V_{OFF}$ (V) | S.S. (V/Decade) |
|---|---|---|---|
| ZnO | $6.1 \times 10^7$ | −19.0 | 1.37 |
| MZO | $6.7 \times 10^7$ | −19.0 | 1.24 |
| m-MZO | $3.5 \times 10^{10}$ | −13.0 | 0.53 |

TABLE 2

Voltage-blocking capabilities and output characteristics of m-MZO HVTFTs with three different channel lengths (L = 10 μm, 15 μm, 25 μm):

| L(μm) | Ion (A) | Blocking Voltage(V) | Maximum Drain Current (A) |
|---|---|---|---|
| 25 | $3.3 \times 10^{-6}$ | 609 | $3.2 \times 10^{-5}$ (at $V_{DS}$ = 200 V*) |
| 15 | $5.8 \times 10^{-6}$ | 447 | $3.0 \times 10^{-5}$ (at $V_{DS}$ = 110 V) |
| 10 | $3.5 \times 10^{-5}$ | 305 | $1.3 \times 10^{-4}$ (at $V_{DS}$ = 70 V) |

*instrument limit

The PV energy conversion system of FIG. 11 illustrates an application of high voltage transistors of the present invention. The solar converter system includes (i) a transformer-less boost-up DC/DC converter with a smaller size, and (ii) a full bridge DC/AC inverter with better waveform over the conventional bulky counterpart.

Considering the integration process and low-cost issues, the diodes in the converter and inverter of FIG. 11 can be made through biasing the HVTFT into the diode-configuration by connecting the gate with drain. For the DC/DC converter, the diode is to separate input and output circuit. It has to block the same high voltage as the HVTFT does. In designing of this configuration, the offset region between gate and source, instead of between gate and drain is needed. For the DC/AC inverter, the diode is connected to the HVTFT in parallel.

Advantages of the Invented MZO HVTFT (1) MZO high voltage TFT (HVTFT) on glass offers significant cost reduction. As the price of photovoltaics (PV) drops, the inverters for energy conversion plays a more important role in the overall cost. Currently, the inverter counts more than 10% of the total cost of the entire PV system. The MZO HVTFT technology significantly cuts the PV costs due to its abundant and cheap materials resources without using expensive and toxic indium, low-temperature fabrication, and PV-SOG configuration. This particularly benefits the large-area electronic systems, such as PV and smart glass technologies.

(2) MZO HVTFT offers the balance between esthetics and energy efficiency. The conventional solar panels are heavy, space consuming and poor appearance. Installing solar panels will strongly affect the appearances of buildings. Unlike the conventional solar panel which is separately installed on roofs after completion of the building, BIPV serves as building elements so that the appearance of houses won't be compromised due to the post-installation of the solar panels.

(3) A unique symmetric ring-structure of TFT design and structure. A rectangular channel is the common TFT design, where the highest electrical field would occur at the corners, limiting the blocking voltage of the device. A ring structure is designed to prevent high electrical field crowding at such a conventional rectangular channel, resulting in the much higher blocking voltage due to more uniform electric field distribution in the TFT channel.

(4) HVTFT uses the MZO instead of the pure ZnO as the channel to significantly enhance the thermal stability and threshold voltage stability, especially the NBS, which are critical for the high voltage performance.

(5) Unique interface design between MZO channel and gate dielectric layer. The MgyZn1-yO transition layer (MZO-TL) serves as the diffusion barrier and the modulation doping in the interface of the MZO HVTFT reduces the interface trap density; therefore, significantly enhance the HVTFT's electrical characteristics high voltage blocking capability, and the performance reliability.

Comparison with the Other High Voltage Device Technologies (1) The MZO HVTFT uses low temperature fabrication process and glass as substrates. SiC and GaN transistors do offer superior performance in high voltage electronics. However, both require epitaxial growth at high temperature on the single-crystal substrates, impossible in SOG. Also, both are much expensive in materials and fabrication.

(2) The transparent device built on glass. In comparison, the amorphous Si HVTFTs, poly-Si HVTFTs are more suitable for higher speed circuits; however, not for PV-SOG. It suffers from low blocking voltage, non-uniformity from grain boundaries, and higher process temperature. Si-based TFT technology also suffers from the absorption of visible light, restricting its application for transparent electronics.

(3) The MZO HVTFT offers better stability and reliability than the organic TFTs. The high-voltage organic thin-film transistor (HVOTFT), though is low cost, suffers from the low mobility, poor long-term stability, and the degradation at higher temperatures; therefore, is unsuitable for the application in PV-SOGs, which operate under sunlight radiation, and its lifetime, like the regular residential solar cells, is expected to be more than 25 years.

(4) The current MZO HVTFT is In-free and "green" technology. The Indium Gallium Zinc Oxide (IGZO) HVTFT operates at above 100 V with an on/off current ratio of 107. However, it is not enough for inverters in solar PV system. It is desired for the PV-SOG to use the indium-free devices due to high cost of indium, especially for utilization in a large-area electronic system such as solar cells. In addition, the toxicity of high indium concentration in IGZO is also a concern to the environment.

It will be understood by those of skill in the art that numerous and various modifications can be made without departing from the spirit of the present invention. Therefore, it should be understood that the various embodiments of the present invention described herein are illustrative only and not intended to limit the scope of the present invention.

The invention claimed is:
1. A Magnesium Zinc Oxide, $Mg_xZn_{1-x}O$ (MZO)-based High Voltage Thin Film Transistor (MZO HVTFT) having a concentric circular structure, comprising
   a substrate;
   a ring-shaped gate electrode deposited on the substrate;
   a circular dielectric insulating layer deposited and patterned over the gate electrode;
   a circular $Mg_yZn_{1-y}O$ transition layer (MZO-TL) over the dielectric insulating layer;
   a $Mg_xZn_{1-x}O$ (MZO) ring-shaped channel layer deposited and patterned over the transition layer (TL) so as to be concentric with the gate electrode;
   a circular electrode deposited over the channel layer so as to be concentric with the gate electrode to serve as a drain for the MZO HVTFT;
   a ring-shaped electrode deposited over the channel layer so as to be concentric with the gate electrode to serve as a source for the MZO HVTFT; and
   a passivation layer deposited on the MZO HVTFT;
   wherein a first offset region ($L_{GD}$) is defined between the gate and the drain, and a second offset region ($L_{GS}$) is defined between the gate and the source, further wherein the gate electrode, the source and the drain are arranged in a concentric alignment; and
   wherein $0<x\leq 0.05$, and $x\leq y\leq 1$.

2. The MZO HVTFT of claim 1, wherein the value of y in the $Mg_yZn_{1-y}O$ transition layer (MZO-TL) is selected so as to cause the MZO-TL to function as a diffusion barrier layer to effectively suppress the interface diffusion of Zn from said MZO channel layer into said gate dielectric layer and thereby improve the blocking voltage of said MZO HVTFT and also to improve the long-term stability of said MZO HVTFT.

3. The MZO HVTFT of claim 1, wherein the value of y in the $Mg_yZn_{1-y}O$ transition layer (MZO-TL) tapers in a range between x and 1.0, inclusive, and further wherein the value of x remains constant in the $Mg_xZn_{1-x}O$ (MZO) channel layer.

4. The MZO HVTFT claim 1, wherein x in the $Mg_xZn_{1-x}O$ (MZO) channel is about 0.05.

5. The MZO HVTFT of claim 1, wherein y in $Mg_yZn_{1-y}O$ transition layer (MZO-TL) tapers from y=1.0 at the interface of the MZO-TL with the dielectric insulating layer to y=x at the interface of the MZO-TL with the $Mg_xZn_{1-x}O$ (MZO) channel.

6. The MZO HVTFT of claim 1, wherein the Magnesium Zinc Oxide transition layer (MZO-TL) has a thickness in a range of from about 5 nm to about 15 nm.

7. The MZO HVTFT of claim 1, wherein the first offset between the gate and the drain, and the second offset between the gate and the source each have a corresponding width dimension, and wherein a combination of the width dimensions of the first and the second offsets and a ratio of the width dimensions of the offset regions determine a balance between high on-current and high blocking voltage for the MZO HVTFT.

8. The MZO HVTFT of claim 1, wherein the dielectric insulating layer comprises a material selected from the group consisting of $SiO_2$, $Al_2O_3$, $HfO_2$, AlN, and any combination thereof.

9. The MZO HVTFT of claim 1, wherein the dielectric insulating layer comprises a stack structure formed by a plurality of layers each independently comprising a material selected from the group consisting of $SiO_2$, $Al_2O_3$, $HfO_2$, and any combination thereof.

10. The MZO HVTFT of claim 1, wherein the ring-shape bottom gate, the circular drain contact, the ring-shape source contact are highly conductive electrodes with low-contact resistivity.

11. The MZO HVTFT of claim 10 wherein the highly conductive electrodes comprises a transparent conductive oxide, selected from the group consisting of Ga-doped ZnO (GZO), Al-doped ZnO (AZO), Flourine-doped Tin Oxide (FTO), and any combination thereof.

12. The MZO HVTFT of claim 1, wherein the substrate is a transparent material selected from group consisting of glass and ceramics.

13. The MZO HVTFT of claim 1, wherein the substrate is disposed on a tile, a roof, or a wall.

14. A photovoltaic PV system on glass (PV-SOG) comprising the MZO HVTFTT of claim 1 for constructing distributed micro-inverters that are integrated with the PV-SOG.

15. The photovoltaic PV system of claim 14, wherein the micro-inverters comprise DC/DC converter and DC/AC inverter.

16. A building integrated photovoltaic (BIPV), comprising the MZO HVTFTT of claim 1 for constructing self-powered smart window.

17. A high speed printer or a digital radiology instrument comprising the MZO HVTFT of claim 1 in an imaging path.

18. A method of manufacturing Magnesium Zinc Oxide, $Mg_xZn_{1-x}O$ (MZO)-based High Voltage Thin Film Transistor (MZO HVTFT) having a concentric circular structure, comprising
   (a) depositing and patterning a ring-shaped gate electrode on a substrate;
   (b) depositing and patterning a circular dielectric insulating layer over the gate electrode;
   (c) depositing and patterning a circular $Mg_yZn_{1-y}O$ transition layer (MZO-TL) over the dielectric insulating;
   (d) depositing and patterning a $Mg_xZn_{1-x}O$ (MZO) ring-shaped channel layer over the transition layer so as to be concentric with the gate electrode;
   (e) depositing and patterning a circular electrode over the channel layer so as to be concentric with the gate electrode to serve as the drain for the MZO HVTFT;
   (f) depositing a ring-shaped electrode over the channel layer so as to be concentric with the gate electrode to serve as the source for the MZO HVTFT; and
   (g) depositing a passivation layer on the MZO HVTFT;
   wherein,
   the $Mg_yZn_{1-y}O$ transition layer (MZO-TL) and the $Mg_xZn_{1-x}O$ (MZO) channel layer formed through sequential deposition of controlled Mg doping;
   $0<x\leq 0.05$; and $x\leq y\leq 1$.

19. The method of claim 18, wherein the y value in the $Mg_yZn_{1-y}O$ transition layer (MZO-TL) is achieved through the modulation doping of Mg during growth.

20. The method of claim 18, wherein y tapers from 1.0 at the interface of the MZO-TL with the dielectric insulating layer to x at the interface of the MZO-TL with the $Mg_xZn_{1-x}O$ (MZO) channel layer.

21. The method of claim 18, wherein x in the $Mg_xZn_{1-x}O$ (MZO) channel layer is constant in the range of $0<x\leq 0.05$.

22. The method of claim 18, wherein each step of depositing is achieved with a technology tool selected from the group consisting of Metalorganic Chemical Vapor Deposition (MOCVD), pulsed laser deposition (PLD), atomic layer deposition (ALD), and multi-target sputtering, and any combination thereof.

* * * * *